(12) United States Patent
Cheng et al.

(10) Patent No.: US 6,943,409 B1
(45) Date of Patent: Sep. 13, 2005

(54) TRENCH OPTICAL DEVICE

(75) Inventors: Kangguo Cheng, Beacon, NY (US); Ramachandra Divakaruni, Ossining, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,699

(22) Filed: May 24, 2004

(51) Int. Cl.[7] ............................................. H01L 29/76
(52) U.S. Cl. ....................... 257/330; 438/427; 257/466; 257/401
(58) Field of Search ................................ 438/637, 427; 257/330, 401, 117, 466

(56) References Cited

U.S. PATENT DOCUMENTS

| | | | | |
|---|---|---|---|---|
| 4,916,087 A | * | 4/1990 | Tateoka et al. | ............. 438/427 |
| 5,294,562 A | * | 3/1994 | Lur et al. | ................... 438/427 |
| 6,177,289 B1 | | 1/2001 | Crow et al. | |
| 6,218,262 B1 | * | 4/2001 | Kuroi et al. | ................. 438/401 |
| 6,261,623 B1 | * | 7/2001 | Moeller | ....................... 426/540 |
| 6,287,974 B1 | * | 9/2001 | Miller | ......................... 438/706 |
| 6,451,702 B1 | | 9/2002 | Yang et al. | |
| 6,538,299 B1 | | 3/2003 | Kwark et al. | |
| 6,667,528 B2 | | 12/2003 | Cohen et al. | |
| 6,707,075 B1 | | 3/2004 | Rogers et al. | |
| 6,828,626 B2 | * | 12/2004 | Oikawa et al. | ............. 257/330 |

* cited by examiner

*Primary Examiner*—Thao P. Le
(74) *Attorney, Agent, or Firm*—Graham S. Jones, II

(57) ABSTRACT

A semiconductor device is formed in on a semiconductor substrate starting with a first step, which is to form a wide trench and a narrow trench in the substrate. Then form a first electrode in the narrow trench by depositing a first fill material of a first conductivity type over the device to fill the wide trench partially and to fill the narrow trench completely. Etch back the first fill material until completion of removal thereof from the wide trench. Form a second electrode in the wide trench by filling the wide trench with a second fill material of an opposite conductivity type. Anneal to drive dopant both from the first fill material of the first electrode into a first outdiffusion region in the substrate about the periphery of the narrow trench and from the second fill material of the second electrode into a second outdiffusion region in the substrate about the periphery of the wide trench.

20 Claims, 22 Drawing Sheets

TRENCH OPTICAL DEVICE

BACKGROUND OF INVENTION

This invention relates to trench optical devices formed in semiconductor substrates, and more particularly to one or more trench lateral p-i-n photodiodes alone or in an array in a photodetector.

Trench lateral p-i-n photodiodes are semiconductor devices including one or more photodiodes each of which comprises a sandwich of an anode, an intrinsic region and a cathode. The anode comprises a region composed of a material such as polysilicon doped with a P-type dopant and the cathode comprises a region composed of a material such as polysilicon doped with an N-type dopant. The intrinsic region comprises a semiconductor region which is lightly doped with a dopant such as a light doping with a P-type dopant. When a high intensity light signal impinges on one or more photodiodes alone or in a photodetector, each photodiode conducts current in reverse mode, or in other words, from cathode to anode generating an output voltage across a load resistor (not shown) between the cathode and the anode. When the light signal disappears or weakens to a low intensity, the current generated by the photodiode ceases, and the lack of current decreases the voltage appearing across the load resistor.

In summary, a p-i-n semiconductor diode is formed with an intrinsic (i) semiconductor region located between an anode which comprises a P-type region (doped with a P type dopant) and a cathode which comprises an N-type region (doped with an N type dopant).

Referring to a commonly assigned U.S. Pat. No. 6,177,289 of Crow et al. entitled. "Lateral Trench Optical Detectors," a lateral p-i-n photodiode is described which is formed by alternating parallel N-type trenches and P-type trenches formed in an intrinsic "i" semiconductor which is lightly doped. U.S. Pat. No. 6,538,299 of Kwark entitled "Silicon-On-Insulator (SOI) Trench Photodiode" U.S. Pat. No. 6,451,702 of Yang et al. entitled "Methods for Forming Lateral Trench Optical Detectors," and U.S. Pat. No. 6,667,528 of Cohen et al. entitled "Silicon-On-Insulator (SOI) Lateral Photodetector with a Reflecting Mirror and Backside Contact and Method for Forming the Same", which are commonly assigned, describe aspects of lateral trench photodetectors.

Publications pertinent to the subject of deep trench, lateral p-i-n photodiodes include M. Yang et al. "A High-Speed, High-Sensitivity Silicon Lateral Trench Photodetector," IEEE electron device letters, vol. 23, pp 395–397 (2002); and M. Yang et al. "High Speed Silicon Lateral Trench Detector on SOI Substrate," IEDM, pp 547–550 (2001). Such photodiodes can be employed as either individual diodes for detecting pixels or can be employed in an array of distributed P and N regions which are interconnected to provide combined signals in response to an optical beam data received by elements of the array to provide a signal with enhanced amplitude. For example such photodetectors can be employed in optical data transmission systems.

FIG. 1A shows a schematic, elevational, sectional view taken along section line 1A—1A in FIG. 1B of a prior art type of a single lateral p-i-n photodiode 6 which is a component of a photodetector 10.

FIG. 1B is a plan (top) view of a layout of the photodetector 10 which includes an interconnected parallel array of photodiodes including the photodiode 6 of FIG. 1A taken along line 1B—1B in FIG. 1A.

FIG. 1A is an enlarged sectional elevation of the single lateral p-i-n photodiode 6, which is shown there as a stand alone device, but which is shown as part of a parallel array of interconnected photodiodes in FIG. 1B.

In FIG. 1A, the single lateral p-i-n photodiode 6 is formed in a conductive semiconductor substrate 12, comprising a lightly doped with P-type dopant forming a central intrinsic "i" region 11. Side views of two parallel deep trenches 7 and 8 having the same width of $W_N$ are shown formed in the substrate 12 on either side of the central intrinsic "i" region 11. On left side of the central intrinsic "i" region 11 in FIG. 1A, the deep trench 7 is filled with an anode 22 comprising polysilicon doped with a P-type dopant. To the right of the central intrinsic "i" region 11 in FIG. 1A, the deep trench 8 is filled with a cathode 26 comprising polysilicon doped with an N-type dopant, as will be well understood by those skilled in the art of lateral trench photo-detectors that are formed in semiconductors. Surrounding the anode 22 is a P-type doped outdiffusion region 23; and surrounding the cathode 26 is an N-type doped outdiffusion region 27. Contact 28P, that is formed atop of the anode 22, is connected to ground by a lead line 30. Contact 28N, which is formed on top of cathode 26, is connected to another lead line 31. A pad layer 14 is formed on top of the substrate 12, aside from the contacts 28P and 28N. As described above, light passing through the pad layer 14 into the intrinsic region 11 are generates holes "h$^+$" and electrons "e$^-$". The holes migrate to the P-type doped anode 22 and electrons migrate to the N-type doped cathode 26 due to the applied voltage $V_{BIAS}$ as indicated in FIG. 1A. Alternatively, the substrate 12 can be lightly doped with N-type dopant.

In FIG. 1B, the anodes 22 are connected to the contact 28P as in FIG. 1A, and the cathodes 26 are connected to the contact 28N. The anodes 22 and cathodes 26 alternate across the substrate 12 with anodes 22 alternating with cathodes 26 and with intrinsic regions 11 located between anodes 22 and cathodes 26. The p-i-n photodiode of FIG. 1A is shown on the left side of FIG. 1B.

FIG. 1C shows a perspective view of the photodetector 10 of FIG. 1B with the array of a set of p-i-n photodiodes formed in a P-doped semiconductor substrate 12. The central intrinsic regions 11 are located between pairs of P-type doped polysilicon cathodes 22 and N-type doped polysilicon anodes 26, both of which are relatively narrow having a width of $W_N$.

FIG. 1D shows a perspective view of the device of FIG. 1B formed in an SOI version of the photodetector 10 with a P-doped semiconductor layer 12 formed on a Buried OXide (BOX) layer 113 formed on a substrate 112. As shown in FIG. 2C, the intrinsic regions 11 are located between pairs of narrow P-type doped polysilicon cathodes 22 and narrow N-type doped polysilicon anodes 23.

The first deep trench 7 and the second deep trench 8, which are formed in parallel with each other in the intrinsic region "i" in substrate 12, have equal narrow widths of $W_N$ ($W_{NARROW}$) as shown in FIGS. 1A and 1B. There are two primary methods in prior art to form the alternating N-type doped and P-type doped trenches 7 and 8. Both methods are complex and costly because both methods require at least two mask levels, two hardmask processes, two planarization processes, and multiple etching processes.

First Prior Art Process

1. Start with a semiconductor type of substrate with a planar surface.

2. Form a pad layer atop the semiconductor substrate and form a first hardmask layer atop the pad layer. As indicated above, in the final device, light passes through the pad layer 14 into the intrinsic region 11 generating holes "h$^+$" and electrons "e$^-$".

3. Form a first photoresist layer atop the hardmask layer.
4. Pattern the photoresist layer by using a first mask.
5. Transfer the pattern from the photoresist layer to the hardmask layer.
6. Strip the photoresist.
7. Perform an etch process through the patterned hardmask to form deep trenches having the same dimension in the substrate.
8. Strip the remaining hardmask.
9. Fill all of the trenches with a sacrificial material such as BSG (BoroSilicateGlass).
10. Form a second hardmask.
11. Form a second photoresist layer.
12. Pattern the second photoresist layer to expose the top of the every other trench by using a second mask. Transfer the pattern from the second photoresist layer to the second hardmask layer.
13. Strip the second photoresist layer.
14. Remove the sacrificial material from every other trench through openings in the second hardmask creating a first set of empty trenches leaving a second set of full trenches therebetween.
15. Strip the remaining second hardmask.
16. Fill the first set of empty trenches with a first layer of polysilicon doped with first type of P or N type dopant.
17. Perform a first planarization step (e.g., CMP) to planarize the first layer of polysilicon and expose the sacrificial material. Remove the sacrificial material from the other set of trenches.
18. Fill empty trenches with polysilicon with other type of P type or N type dopant.
19. Perform a second planarization step (e.g. CMP) to remove excess polysilicon.
20. Form contacts.

This first prior art process has several disadvantages. First, it is complex and costly since it requires at least two mask levels, two hardmask deposition steps, two planarization steps, and multiple pattern transfer steps to form the alternating N-type doped and P-type doped trenches. Second, the alignment issue between the second mask level and the first mask level results in difficulties in process control. Third, filling the trench with sacrificial material and removing the sacrificial material from a deep trench twice consumes a large quantity of chemicals and requires a very long process time. Finally, there is a defect issue associated with the complex process, which causes device performance and reliability degradation as well as product yield loss.

Second Prior Art Process

1. Start with a semiconductor or SOI type of substrate with a planar surface.
2. Form a pad layer atop the semiconductor substrate and form a first hardmask layer atop the pad layer. As indicated above, in the final device, light passes through the pad layer 14 into the intrinsic region 11 generating holes "h$^+$" and electrons "e$^-$".
3. Form a first photoresist layer atop the hardmask layer.
4. Pattern the photoresist layer by using a first mask for forming the first type of deep trenches.
5. Transfer the pattern from the photoresist layer to the hardmask layer.
6. Strip the photoresist.
7. Perform a first deep trench etch process through the patterned hardmask to form a first type of deep trenches.
8. Strip the first remaining hardmask.
9. Fill the first type of trench with a first polysilicon doped with a first type of dopants.
10. Planarize the first layer of polysilicon.
11. Form a second hardmask layer. Form a second photoresist layer atop the hardmask layer.
12. Pattern the photoresist layer by using a second mask for forming the other type of deep trenches.
13. Transfer the pattern from the photoresist layer to the hardmask layer.
14. Strip the photoresist.
15. Perform a second deep trench etch process through the second patterned hardmask to form a second type of deep trenches.
16. Strip the second remaining hardmask.
17. Fill the empty second set of trenches with polysilicon with the other type of P or N type dopant.
18. Perform a second planarization step to remove excess polysilicon.
19. Form contacts.

The second prior art process also has several disadvantages. First, it is complex and costly since it requires at least two mask levels, two hardmask deposition steps, two planarization steps, and multiple pattern transfer steps to form the alternating N-type doped and P-type doped trenches. Second, the alignment issue between the second mask level and the first mask level results in difficulties in process control. Third, forming deep trenches is a very time-consuming process, so forming two types of deep trenches separately adds considerable process complexity and significant cost. Finally, there is a defect issue associated with the complex process, which causes device performance and reliability degradation as well as product yield loss.

SUMMARY OF INVENTION

A first object of this invention is to provide improved methods for forming optical devices in semiconductor substrates and the devices provided thereby.

Another object of this invention is to provide a method of manufacture of one or more trench lateral p-i-n photodiodes alone or in an array in a photodetector and the devices produced thereby.

Another object of this invention is to save use of mask sets and to save on hardmask deposition and etching processes.

A further object is to save on planarization process steps.

Still another object is to avoid alignment problems, to use process time and to avoid complexity and to provide easy process control.

In addition an object is this invention is to provide a process with reduced susceptibility to defect generation.

In accordance with this invention, a semiconductor device is formed in a semiconductor substrate. A wide trench and a narrow trench are formed in the substrate. A first electrode in the narrow trench comprises a first fill material of a first conductivity type. A second electrode in the wide trench fills the wide trench with a second fill material of an opposite conductivity type. Dopant diffused from the first fill material of the first electrode forms a first outdiffusion region in the substrate about the periphery of the narrow trench. Dopant diffused from the second fill material of the second electrode forms a second outdiffusion region in the substrate about the periphery of the wide trench.

Preferably, a liner is deposited into the narrow trench and the wide trench prior to deposition of the first fill material. Preferably, a contact is formed to the first electrode and a contact is formed to the second electrode. Preferably, a cap layer was formed over the device prior to annealing. Preferably, the material of the first conductivity type comprises N-type doped polysilicon and the material of the second conductivity comprises P-type doped polysilicon. Preferably, the material of the first fill material comprises N-type doped polysilicon and the material of the second fill material comprises P-type doped polysilicon. Preferably, the semiconductor substrate is formed over a buried oxide layer. Preferably, the semiconductor substrate is composed of a material selected from the group consisting of: Si, strained Si, $Si_{1-y}C_y$, $Si_{1-x-y}Ge_xC_y$, $Si_{1-x}Ge_x$, Si alloys, Ge, Ge alloys, GaAs, InAs, InP as well as other III–V semiconductors, II–VI semiconductors, Si-containing materials, a Silicon-On-Insulator (SOI) substrates or a SiGe-On-Insulator (SGOI) substrates. Preferably, the liner material is composed of a material selected from the group consisting of: silicon nitride, Ge, SiGe, WSix, TiN, Ta, Ti, and SiC.

In accordance with still another aspect of this invention, a semiconductor device on a semiconductor substrate is provided. A wide trench and a narrow trench are formed in the substrate. A first electrode formed in the narrow trench is filled with a first fill material of a first conductivity type. A second electrode formed in the wide trench is filled with a second fill material of an opposite conductivity type. A first outdiffusion region is doped with dopant diffused from the first electrode into a region in the substrate about the periphery of the narrow trench and a second outdiffusion region is doped with dopant diffused from the second electrode into a region in the substrate about the periphery of the wide trench. Preferably, the semiconductor device is a photodetector. Preferably, an epitaxial silicon layer is formed on trench sidewalls of the wide trench leaving a space filled with the second electrode. Preferably, the wide trench with the epitaxial layer formed on trench sidewalls has the same opening size as the narrow trench.

BRIEF DESCRIPTION OF DRAWINGS

The foregoing and other aspects and advantages of this invention are explained and described below with reference to the accompanying drawings, in which:

FIG. 1A is an enlarged sectional elevation of the single lateral p-i-n photodiode, which comprises a pair of a P-type doped polysilicon cathode and an N-type doped polysilicon anode with a width of $W_N$, is shown as a stand alone device in FIG. 1A.

FIG. 2A shows a sectional elevation taken along line 2A—2A in FIG. 2B of a single lateral trench p-i-n photodiode, which comprises a wide trench with a width of $W_W$ and a narrow trench with a width of $W_N$. The wide trench is filled with one type of polysilicon, shown in FIG. 2A for example as P-type doped polysilicon, and the narrow trench is filled with the other type of polysilicon, shown in FIG. 2A for example as N-type doped polysilicon. FIG. 2B shows an array of lateral trench p-i-n photodiodes connected in parallel taken along line 2B—2B in FIG. 2A.

FIG. 5A shows a sectional elevation taken along line 5A—5A in FIG. 5B of a single lateral trench p-i-n photodiode with a wide trench lined with epitaxial layer.

FIG. 5B shows an array of optical devices comprising lateral trench p-i-n photodiodes connected in parallel taken along line 5B—5B in FIG. 5A.

DETAILED DESCRIPTION

Figure 2A:
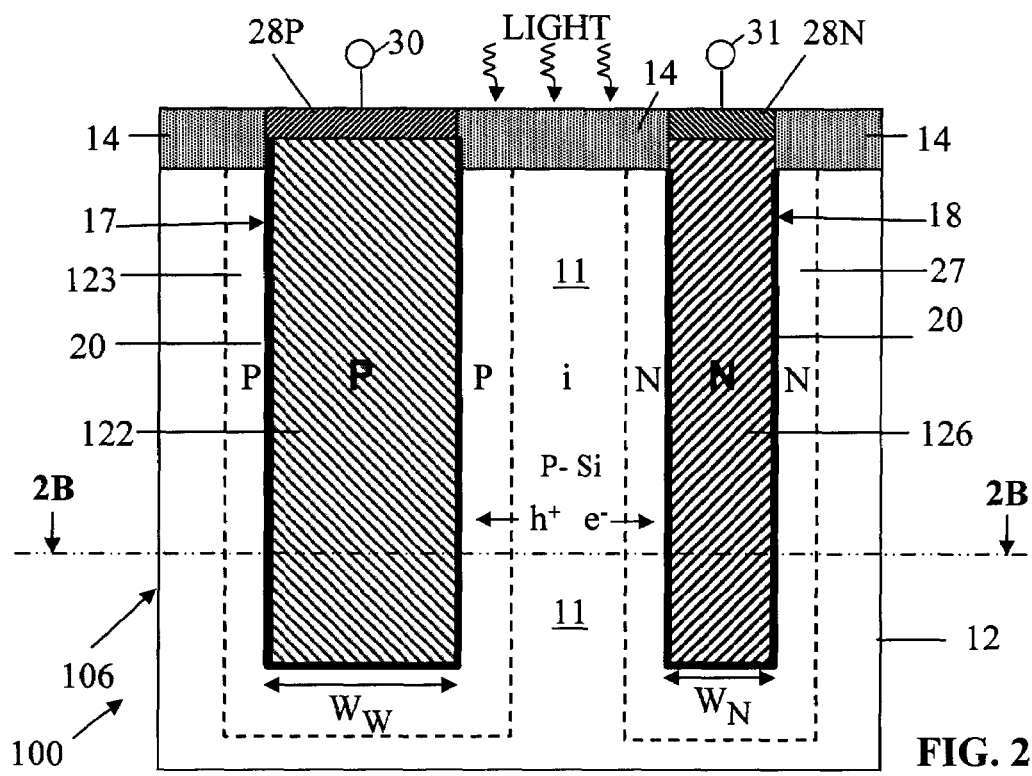
FIGS. 2A and 2B show sectional and plan views of an optical device comprising a lateral trench, p-i-n diode photodetector manufactured by a process in accordance with this invention.
Figure 2B:
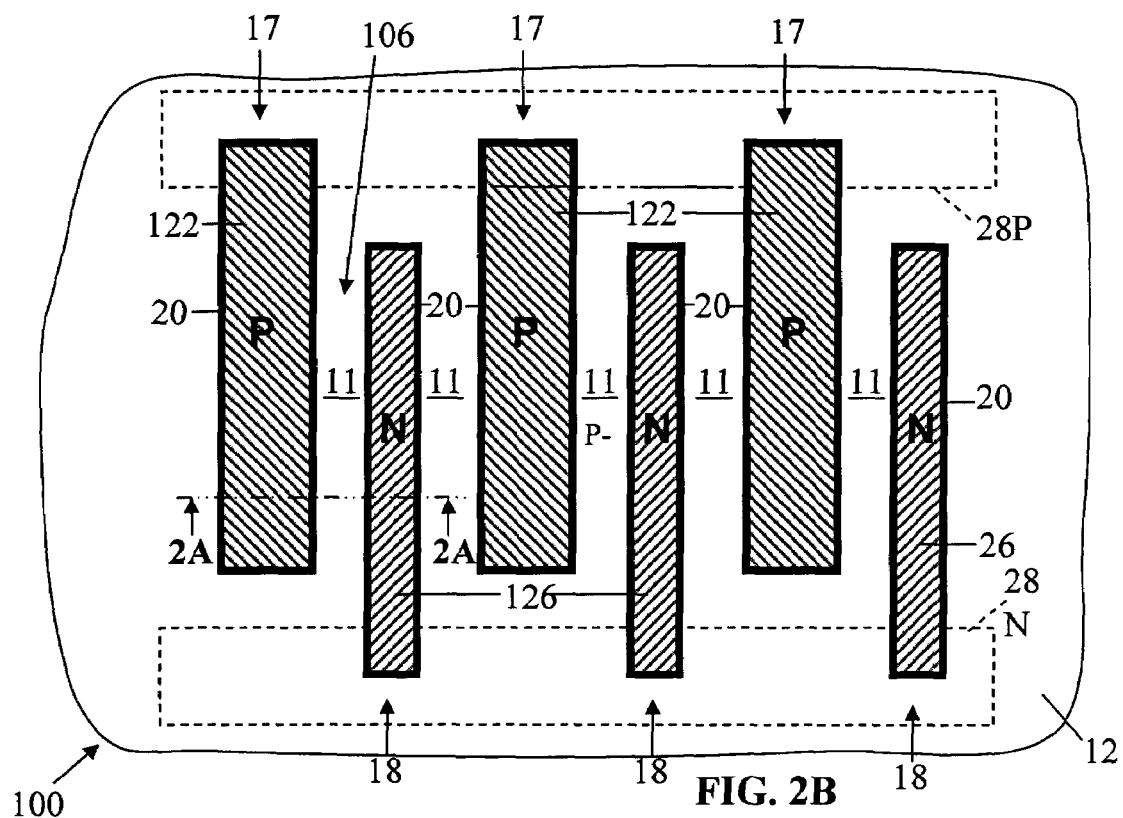

FIGS. 2A and 2B show sectional and plan views of an optical device comprising a lateral p-i-n diode photodetector 100 manufactured by a process in accordance with this invention. FIG. 2A shows a sectional elevation of a single lateral trench p-i-n photodiode and FIG. 2B shows an array of lateral trench p-i-n photodiodes connected in parallel.

FIG. 2A shows an enlarged sectional elevation of the optical device comprising a single lateral p-i-n photodiode 106, which can be a stand alone device or which can be a part of a parallel array of interconnected photodiodes as shown in FIG. 2B. FIG. 2A is a schematic, elevational section of a portion of the photodetector 100 taken along line 2A—2A in FIG. 2B. FIG. 2B comprises a sectional view taken along line 2B—2B in FIG. 2A, which is a plan (top) view of a layout of photodetector 100.

Figure 1A:
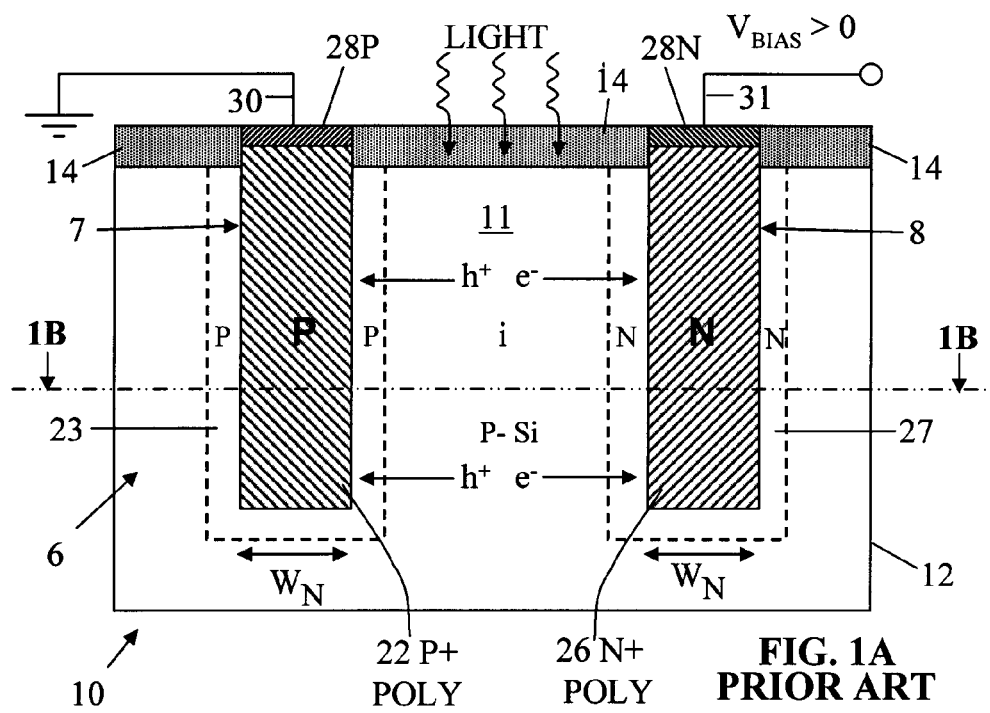
FIG. 1A shows a schematic, sectional elevation taken along line 1A—1A in FIG. 1B of a prior art type of an optical device comprising a single lateral p-i-n photodiode which is a component of a photodetector.
Figure 1B:
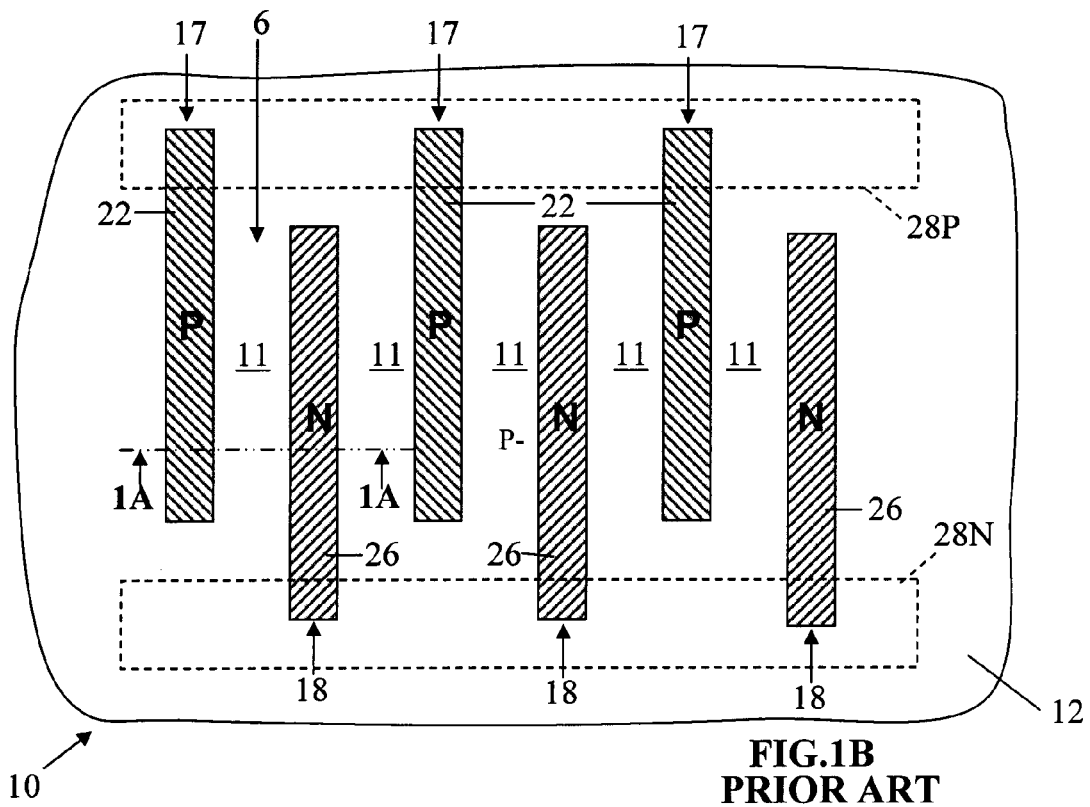
FIG. 1B is a plan (top) view of a layout of the photodetector interconnected parallel array of photodiodes including the photodiode of FIG. 1A taken along line 1B—1B in FIG. 1A.
Figure 1C:
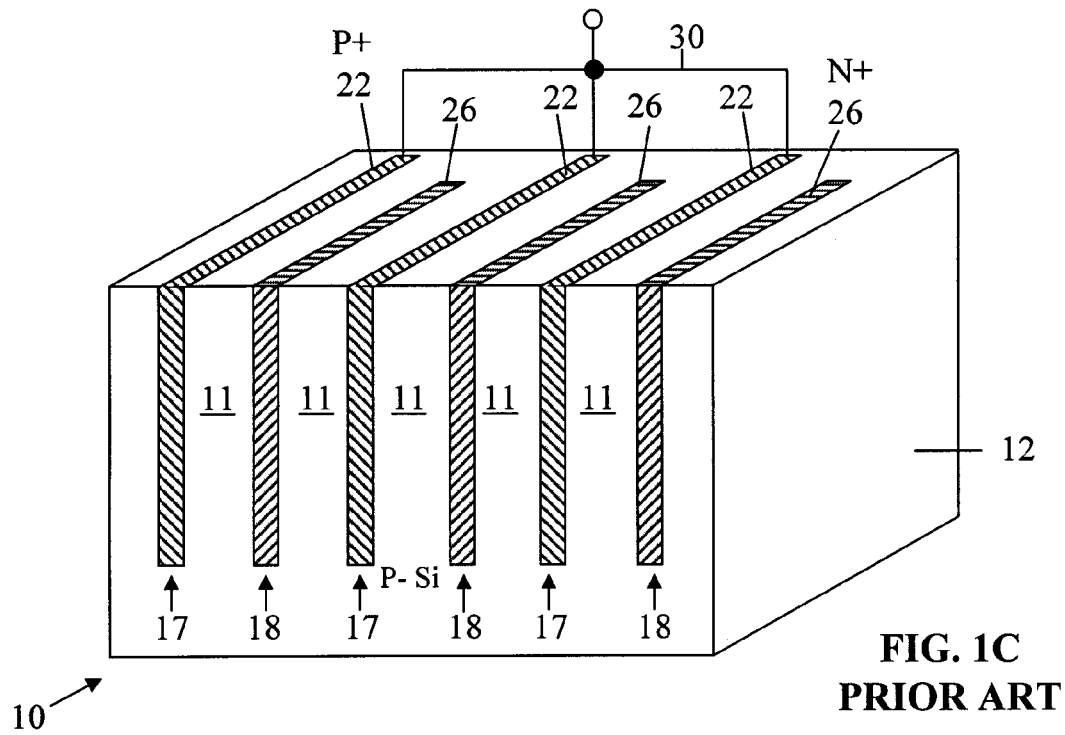
FIG. 1C shows a perspective view of the prior art photodetector of FIG. 1B with the array of p-i-n photodiodes formed in a lightly doped semiconductor substrate with pairs of P-type doped polysilicon cathodes and N-type doped polysilicon anodes, both of which are relatively narrow, having a width of $W_N$.
Figure 1D:
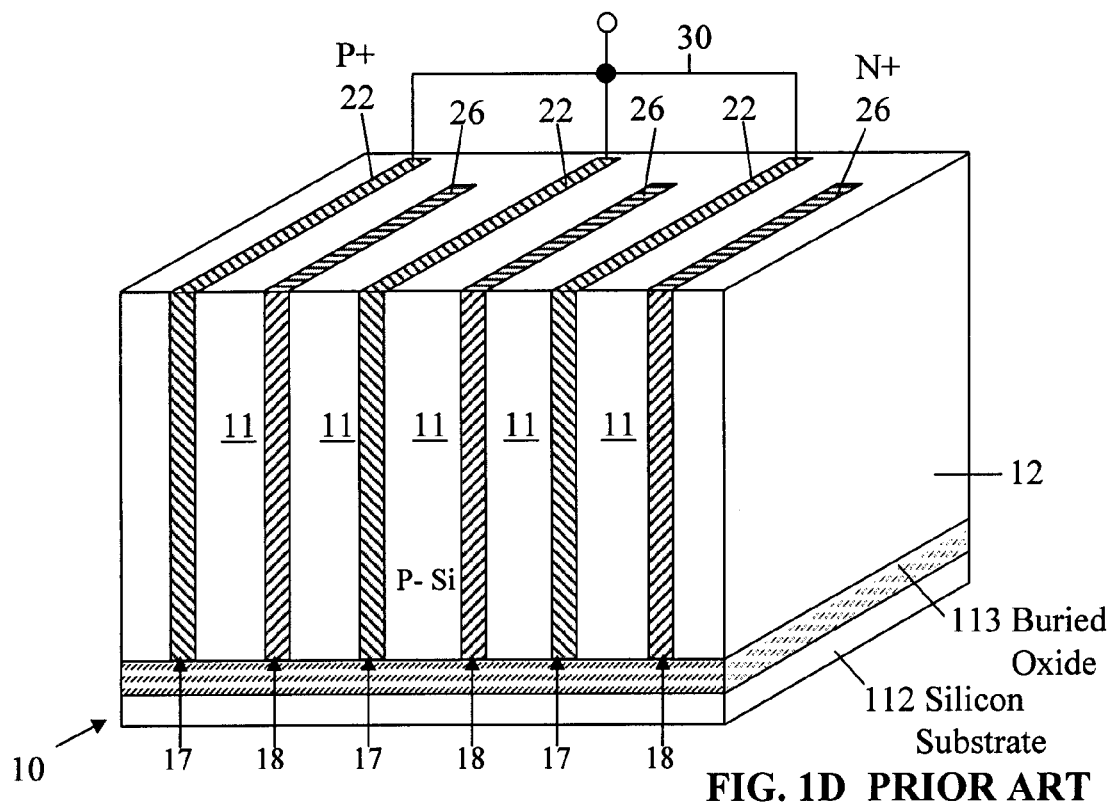
FIG. 1D shows a perspective view of the prior art device of FIG. 1B formed in an SOI version of the photodetector.

In FIG. 2A, the photodetector 100 is different from the photodetector of FIG. 1A in that in place of the narrow trench 7 there is a wide trench 17 which is wider than the narrow trench 18. The narrow trench 18 has a similar width to narrow trench 8 in FIG. 1A. That is to say that in FIG. 2A the wide trench 17, has a width of $W_{WW}$ ($W_{WIDE}$) and the narrow trench 17 has a narrow width of $W_N$ ($W_{NARROW}$). The single lateral p-i-n photodiode 106 is formed in a semiconductor substrate 12 as in FIG. 1A, comprising a lightly doped with P-type dopant (or N-type dopant as alternative) forming a central intrinsic "i" region 11, which may be lightly doped. Side views of two parallel deep trenches 17 and 18 are shown formed in the substrate 12 on either side of the central intrinsic "i" region 11. On the right side of the central intrinsic "i" region 11 in FIG. 2A, the deep narrow trench 18 is filled with a first electrode in the form of a narrow node 126 comprising a first trench filling material doped with a first type of dopant, shown here for example as an N-type dopant. On left side of the central intrinsic "i" region 11 in FIG. 2A, the deep wide trench 17 is filled with a second electrode in the form of a wide node 122 comprising a second trench filling layer doped with an opposite type of dopant, shown here for example as a P-type dopant. In the example shown in FIG. 2A, the wide node 122 comprises a P-type doped polysilicon, and the narrow node 126 comprises an N-type doped polysilicon. Surrounding the P-doped wide node 122 is a lightly P-doped outdiffusion region 123 which has the same P-dopant type of the wide node 122; and surrounding the N-doped narrow node 126 is a lightly N-doped outdiffusion region 127 which has the same dopant type of the narrow node 126. Therefore, the dopant type in the outdiffusion region 123 is opposite to the dopant type in the outdiffusion region 127. In summary in the example shown in FIG. 2A, the outdiffusion region 123 is P-type doped and the outdiffusion region 126 is N-type doped.

Contact 28P, which is formed on top of the second electrode, i.e. the P-doped wide node 122, is connected to lead line 30. Another contact 28N, which is formed on top of the first electrode, i.e. the N-doped narrow node 126, is connected to another lead line 31. A pad layer 14 is formed on top of the substrate 12, aside from the contacts 28P and 28N. As in FIG. 1A, light passing through the pad layer 14 into the intrinsic region 11 generates holes "h$^+$" and electrons "e$^-$"; and the holes migrate to the P-type doped wide second electrode 122 and the electrons migrate to the N-type doped narrow first electrode 126.

Preferably, the wide trench 17 and the narrow trench 18 are lined with a thin, protective silicon nitride liner 20 which is thin enough for holes and electrons to tunnel through to nodes 122 and 123.

In summary, FIG. 2A shows an example of a single lateral p-i-n photodiode 106 which is formed in a semiconductor substrate 12 which is lightly doped with P-type dopant to form an intrinsic "i" region 11 with parallel trenches 17 and 18 formed in substrate 12 on either side of intrinsic "i" region 11. On one side of the intrinsic "i" region 11, the wide trench 17 is filled with a node 122 doped with a P-type dopant. On the other side of the intrinsic "i" region 11, the narrow trench 18 is filled with a node 126 doped with an N-type dopant, as in FIG. 1A.

In FIG. 2B, the wide P-doped nodes 122 are connected to the contact 28P as in FIG. 1A, and the narrow N-doped nodes 126 are connected to the contact 28N. The wide nodes 122 and the narrow nodes 126 alternate across the substrate 12 with wide nodes 122 alternating with the narrow nodes 126 and with intrinsic regions 11 located between the wide nodes 122 and narrow nodes 126. The p-i-n photodiode of FIG. 2A is shown on the left side of FIG. 2B.

Figure 2C:
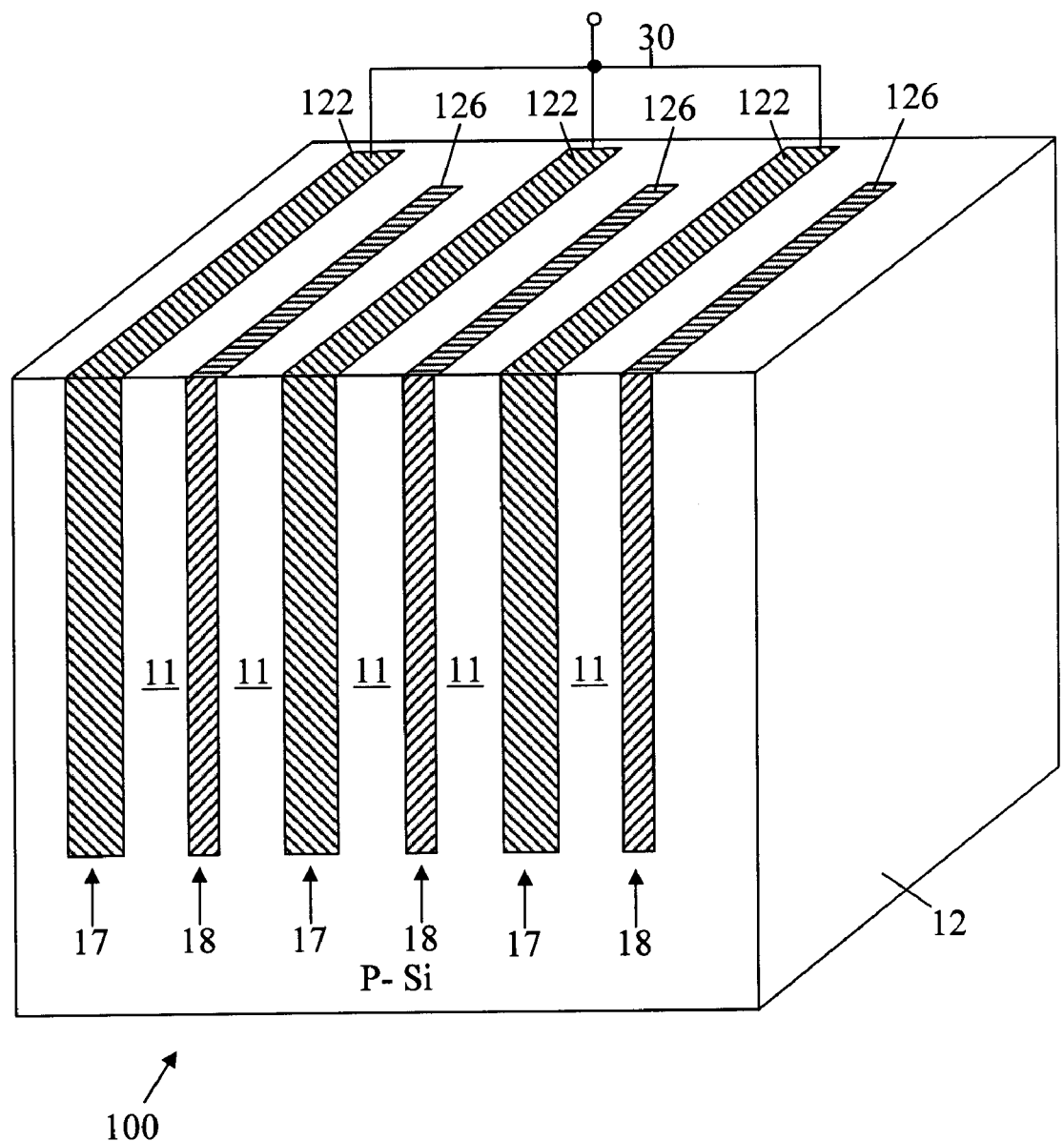
FIG. 2C shows a perspective view of the array of photodiodes of the photodetector of FIG. 2B formed in a lightly doped semiconductor substrate with intrinsic regions located between pairs of P-type doped, polysilicon, wide nodes and N-type doped, polysilicon, narrow nodes.

FIG. 2C shows a perspective view of the array of photodiodes of the photodetector 100 of FIG. 2B formed in a lightly P-doped semiconductor substrate 12. The intrinsic regions 11 are located between pairs of P-doped, polysilicon, wide nodes 122 and the narrow N-doped nodes 126. The wide nodes 122 and the narrow nodes 126 comprise polysilicon doped by opposite dopants. In the example shown here, the wide nodes 122 are P-type doped, and the narrow nodes 126 are N-type doped, or vice versa.

The substrate 12, in which the photodetector 100 is formed, may comprise an intrinsic or lightly doped substrate composed of any semiconductor material, including but not limited to the materials as follows: Si, strained Si, $Si_{1-y}C_y$, $Si_{1-x-y}Ge_xC_y$, $Si_{1-x}Ge_x$, Si alloys, Ge, Ge alloys, GaAs, InAs, InP as well as other III–V and II–VI semiconductors. The substrate 12 may also comprise a Silicon-On-Insulator (SOI) substrate, SiGe-On-Insulator (SGOI) substrate, or Germanium-On-Insulator (GOI). Preferably, substrate 12 comprises a Si-containing material.

The top surface of the substrate is covered by a pad layer 14, which preferably comprises a silicon nitride layer with an optional silicon oxide layer beneath the silicon nitride layer (not shown for convenience of illustration). The thickness of the silicon nitride of the pad layer 14 may range from 10 nm to about 500 nm, preferably on the order of about 100 nm; and the silicon nitride portion of the pad layer 14 may be formed by using a conventional deposition process, such as Chemical Vapor Deposition (CVD), Plasma-Assisted CVD, or Chemical Solution Deposition (CSD). The optional pad oxide (not shown for convenience of illustration) beneath the pad nitride layer may be formed by conventional thermal growth or deposition process. The thickness of the pad oxide ranges from 2 nm to 20 nm, preferably 5 nm.

Trenches are formed by conventional etching processes which are well known in the art.

We have discovered that since the trench 17 is wider than trench 18 it is possible to perform the manufacture of the photodetector 100 using only one mask level. That is to say that only one mask set and one hardmask are required to form the alternating oppositely doped trenches 17 and 18.

First Process Flow

Figure 3:
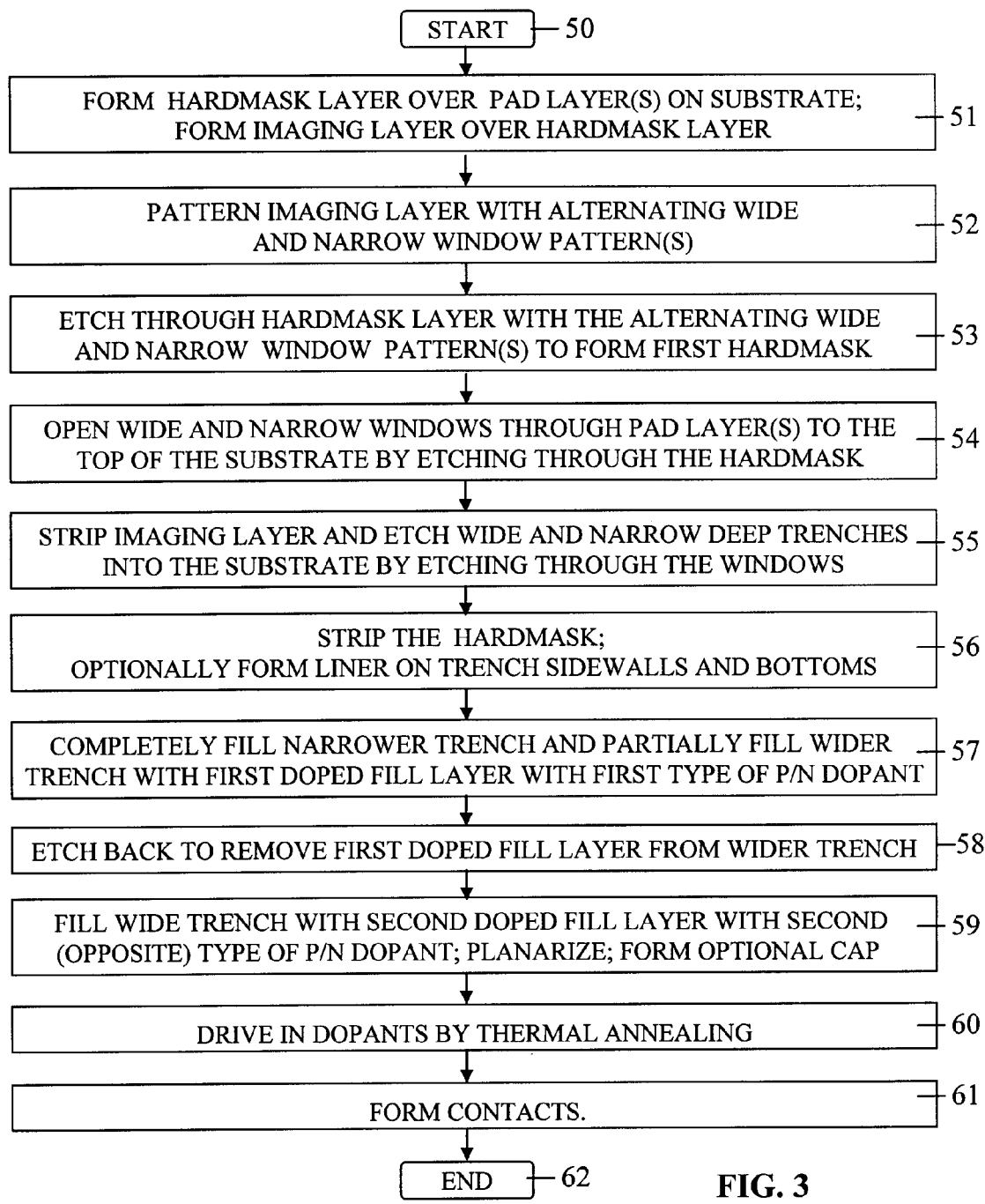
FIG. 3 shows a process flow of a first embodiment of a process in accordance with this invention for forming the photodetector of FIGS. 2A–2C.

FIG. 3 shows a first process flow for forming the photodetector 100 of FIGS. 2A–2C, which involves the steps as follows:

In step 50, the process begins.

Figure 4A:
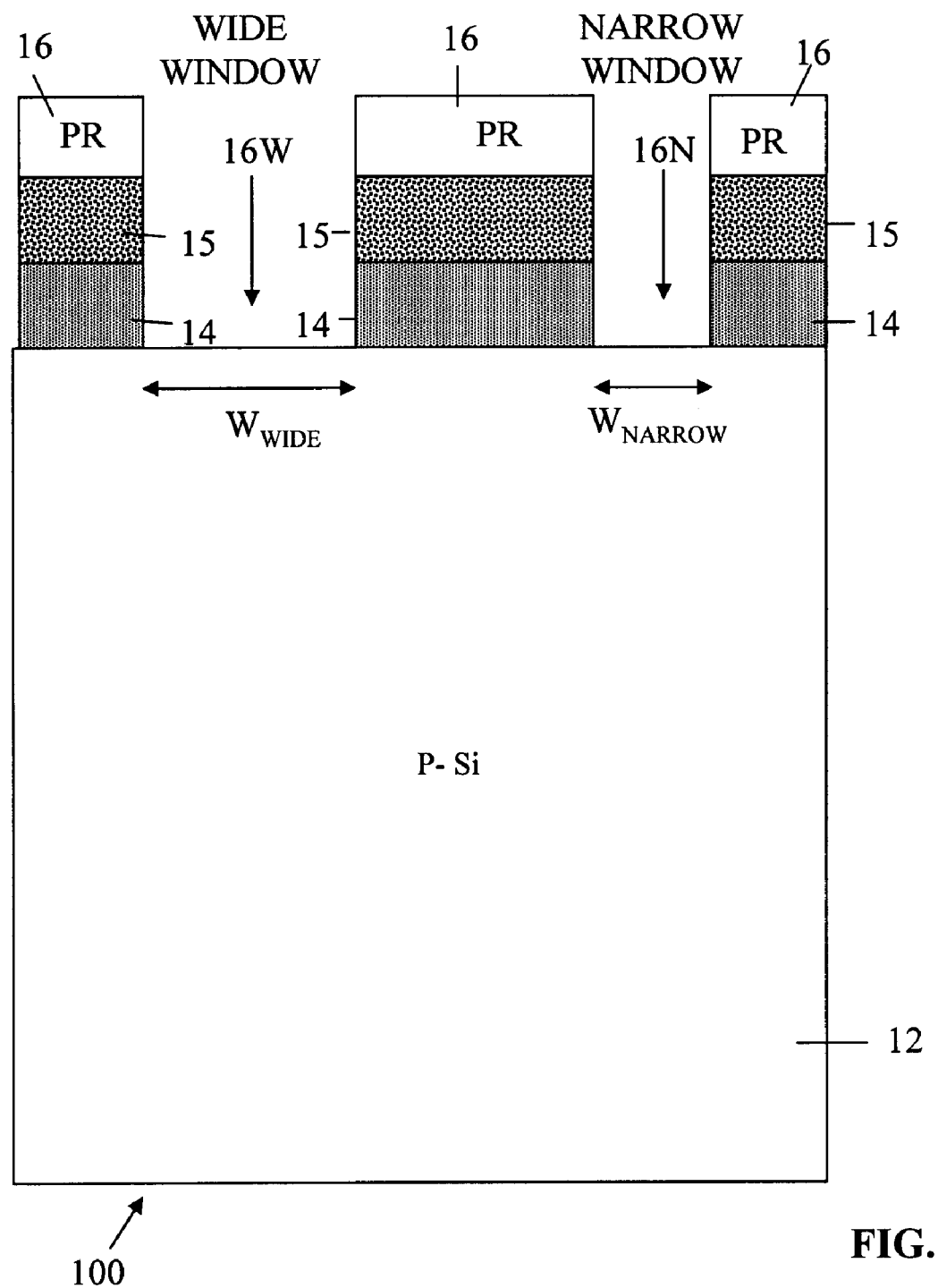
FIGS. 4A–4G illustrate the steps performed in the manufacture of an optical device comprising a trench lateral p-i-n photodiode device which is shown in its completed form in FIGS. 2A and 4G.

In step 51, as indicated by FIG. 4A, a semiconductor substrate 12 was provided covered with a blanket pad layer 14 (which may be laminated layers of silicon oxide and silicon nitride). Then as indicated above, with respect to the prior art devices in the final device, light which passes through the pad layer 14 into the intrinsic region 11 generates holes "h$^+$" and electrons "e$^-$". Then blanket pad layer 14 was covered by a blanket hardmask layer 15. Then an imaging layer 16, e.g., photoresist, was formed over the hardmask layer 15. The layers 15 and 16 are preferably planar in FIG. 4A.

In step 52, as is also indicated by FIG. 4A, the imaging layer 16 was patterned to form a wide window 16W for forming a wide trench 17 and a narrow window 16N for forming a narrow trench 18.

In step 53, as is further indicated by FIG. 4A, the patterned, imaging layer 16 was used to extend the wide window 16W and a narrow window 16N through the hardmask layer by any etching process (e.g. reactive ion etching (RIE) to form a patterned hardmask 15.

In step 54, as indicated by FIG. 4A, the wide window 16W and the narrow window 16N were extended through the pad layer 14 any etching process (e.g. RIE) down to the top of the silicon substrate 12.

Figure 4B:
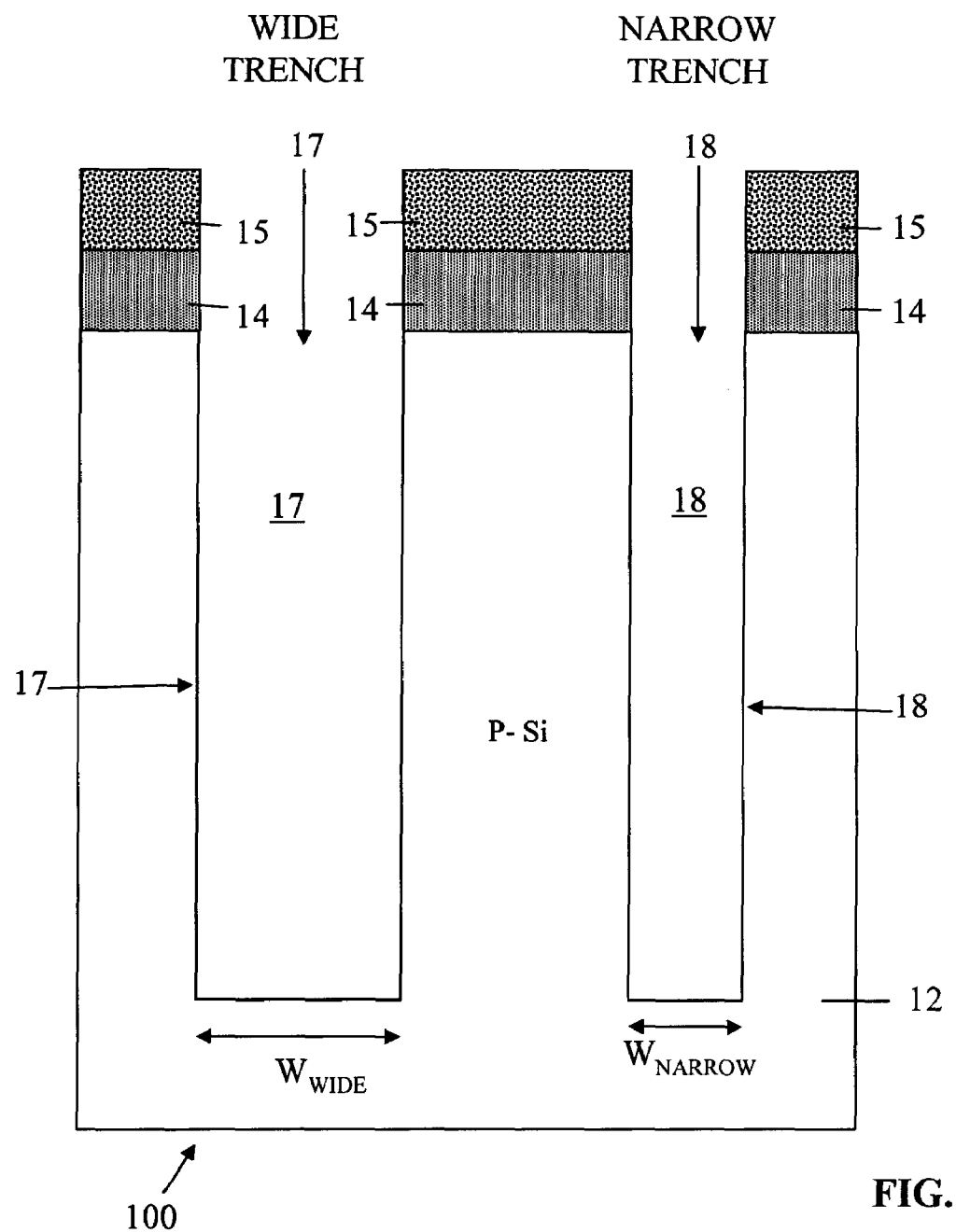

In step 55, as shown in FIG. 4B, the imaging layer 16 was stripped and the set of deep trenches comprising deep, wide trench 17 and deep, narrow trench 18 have etched in the substrate 12, e.g. by RIE.

Figure 4C:
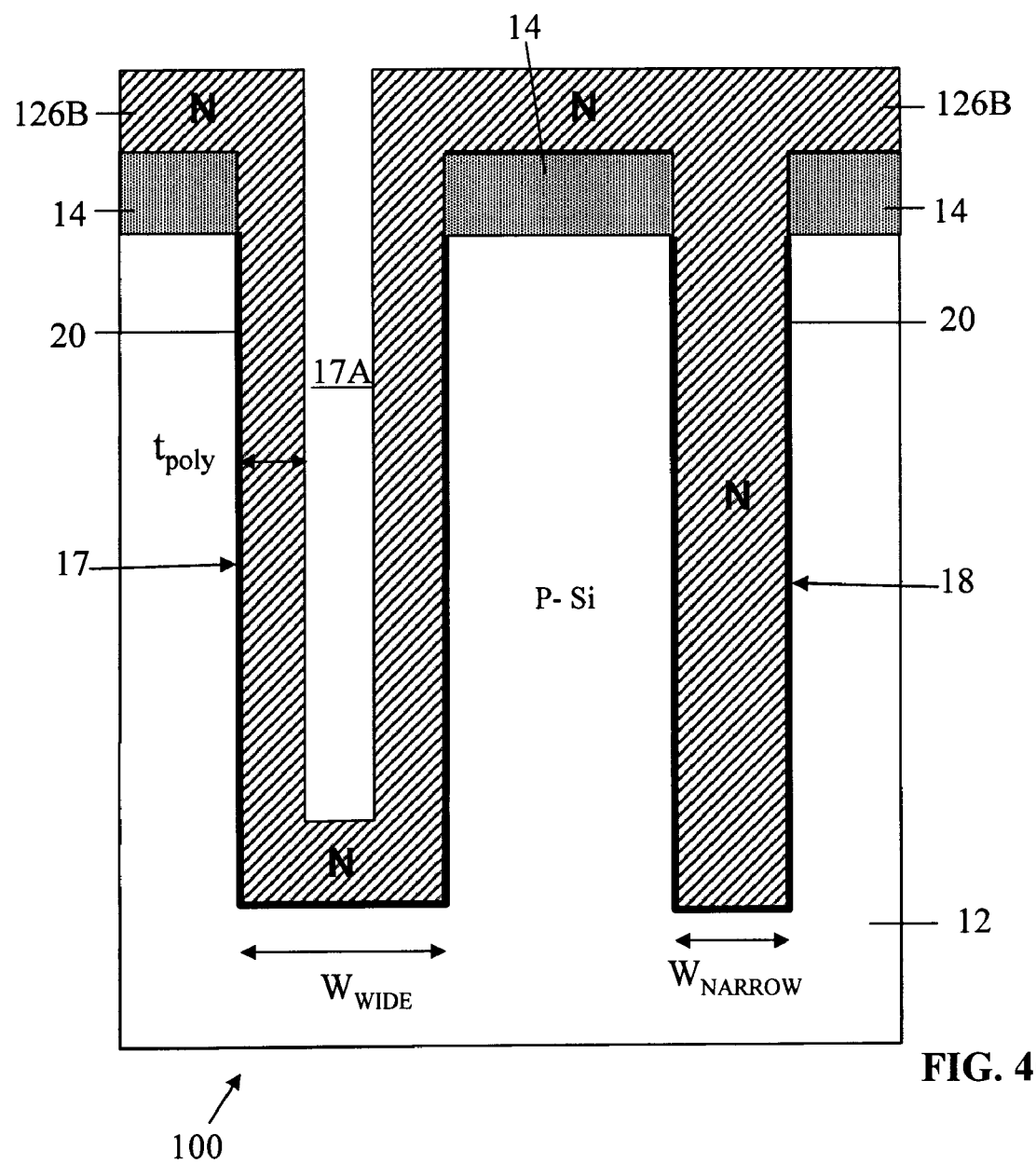

In step 56, as shown in FIG. 4C, the remainder of the hardmask 15 has been stripped.

An optional preliminary step is to form the ultra-thin, protective, conformal liner 20, preferably composed of silicon nitride on the exposed sidewalls and bottom of the trenches 17 and 18, beneath the first trench filling layer 126B. The optional ultra-thin liner 20, has been formed on the exposed sidewalls and bottom of the trenches 17 and 18. The liner 20 prevents the defect formation in the later trench filling process. It also facilitates the later polysilicon etch-back process.

Figure 4D:
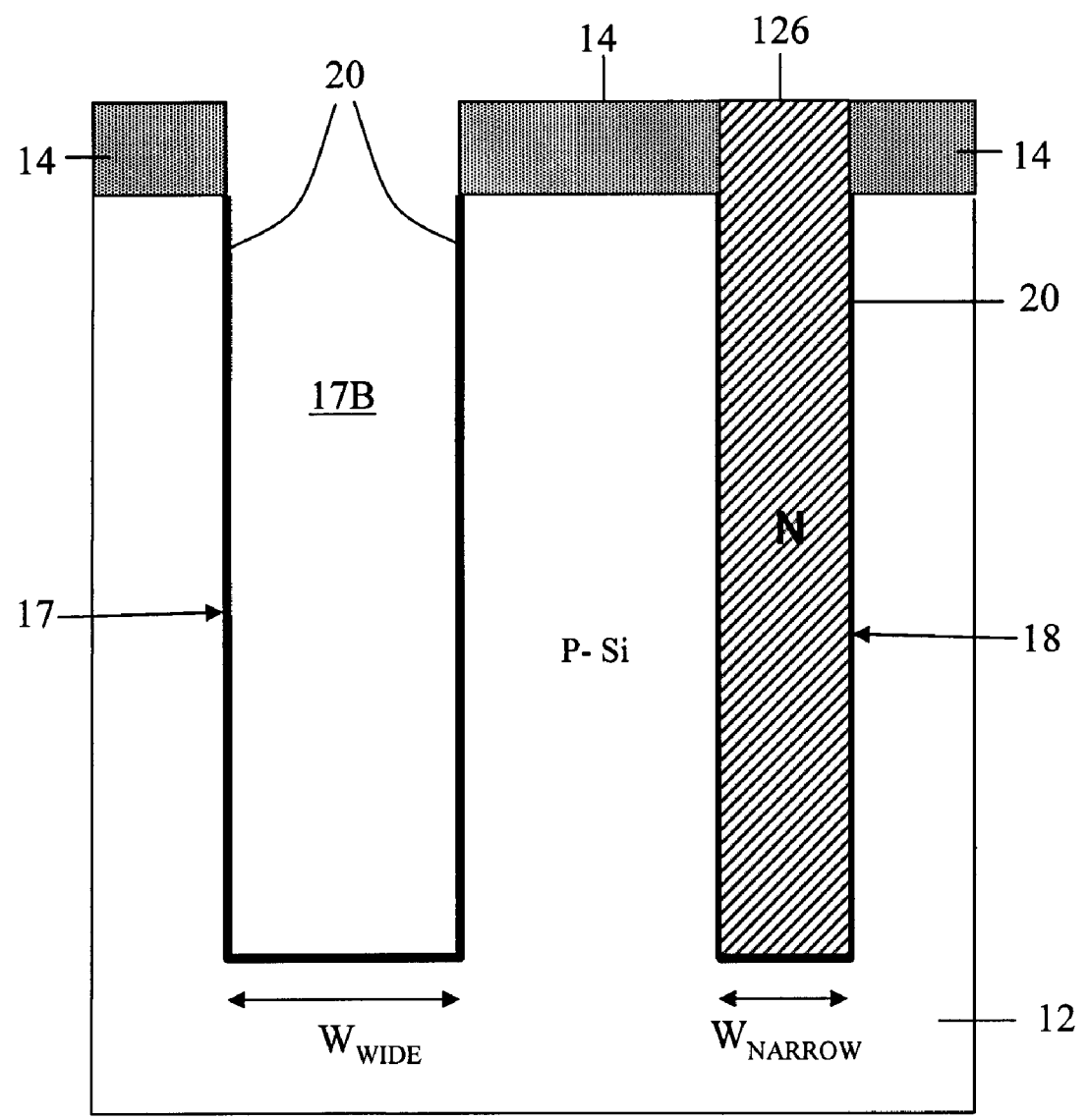

In step 57, as shown in FIG. 4C, the main purpose is to fill the narrow trench 18 completely and to fill the wide trench 17 partially with a first polysilicon 126B doped with a first type of dopant, which in the example shown FIG. 4D is N-doped polysilicon. On one hand the first trench filling layer 126B is thin enough to leave an opening 17A in the trench 17. Yet on the other hand the first trench filling layer 126B is thick enough to fill the narrow trench 18 completely. In any event, the first trench filling layer 126B conformal, blanket, doped, has been formed, which in the example shown is doped with N-type dopant.

In step 58 as shown in FIG. 4D, the blanket first polysilicon layer 126B has been etched back until it has been completely removed from the wide trench 17 while keeping the narrow trench 18 filled to form a first node 126.

Figure 4E:
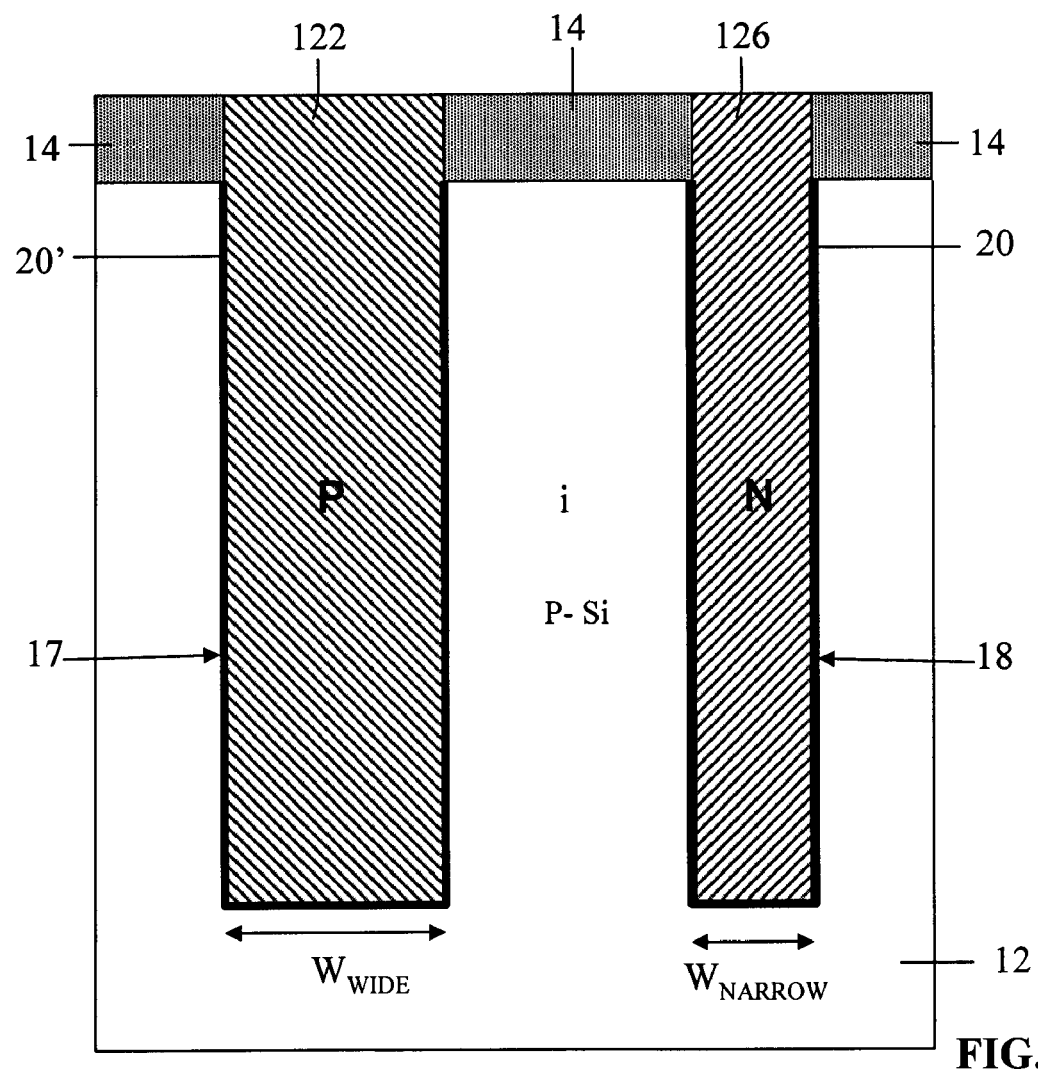

In step 59 as shown in FIG. 4E, the wide trench 17 has been filled with a second blanket polysilicon layer 122 which is doped with a dopant that is opposite to the dopant in the first polysilicon 126. For example, if the first polysilicon 126 is N-type doped, the second polysilicon 122 is P-type doped. Optionally, the excessive polysilicon is removed by etching or Chemically Mechanical Polishing (CMP) to the level of the top surface of the pad layer(s) 14.

Figure 4F:
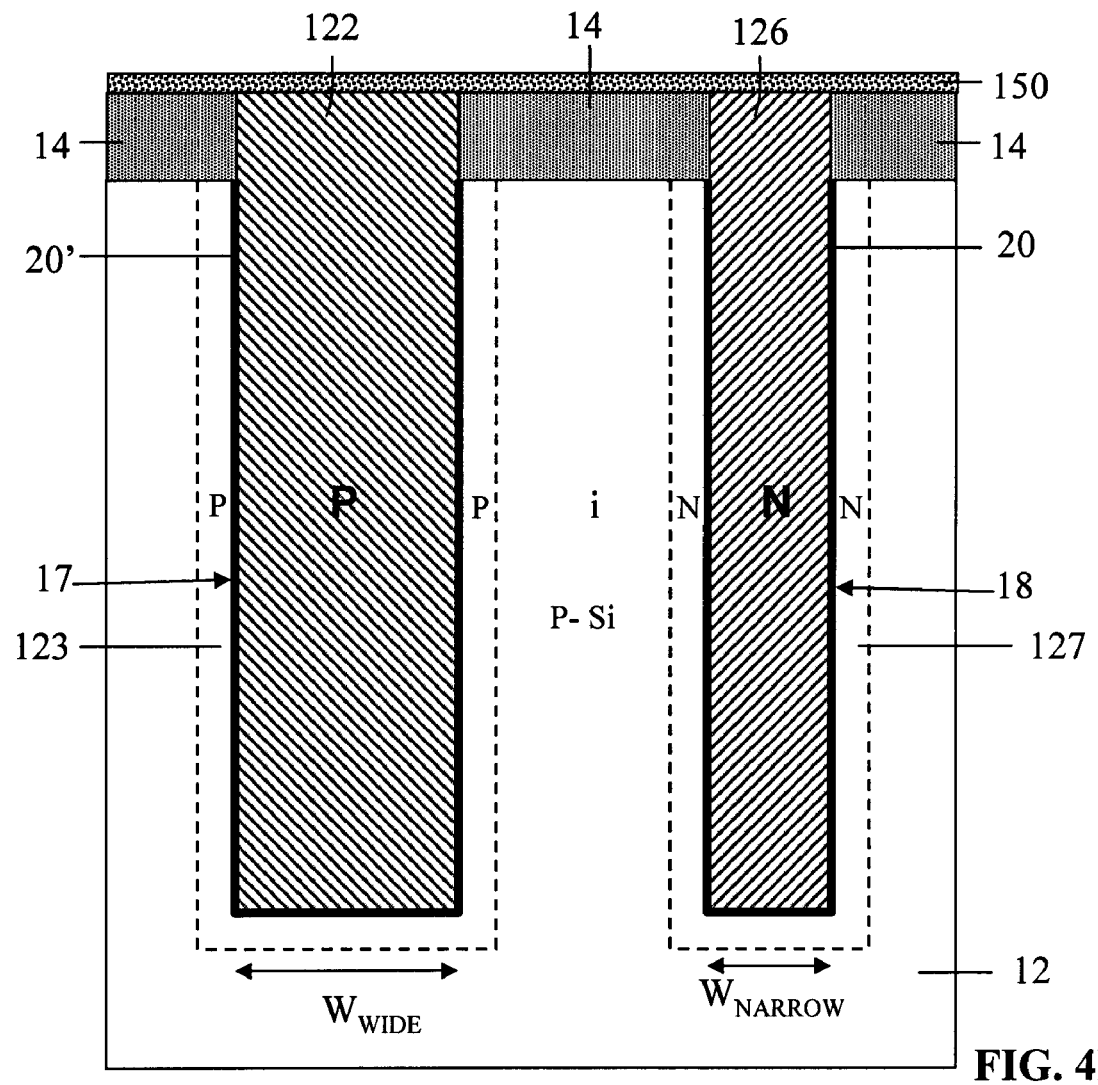

In step 60 as shown in FIG. 4F an anneal has been performed to drive the dopants from the conductive filling materials of nodes 122/126 (e.g. the doped trench polysilicon) diffusing into the substrate 12 to form the p-i-n structure. Some of the dopant from the P-doped node 122 is driven into the substrate 12 to form the outdiffusion region 123 surrounding node 122; and some of the dopant from the N-doped node 126 is driven into the substrate 12 to form the outdiffusion region 127 surrounding node 126.

Furthermore, at this point, prior to the annealing step, an optional cap layer 150 composed of a material such as silicon oxide, silicon nitride, or silicon carbide, may be deposited over the top surfaces of device 100 and in particular across the top of node 122 and node 126 to prevent cross doping during the following annealing process. If a cap layer 150 has been applied to the top surfaces of device 100, then the cap layer 150 is stripped following the annealing process.

Figure 4G:
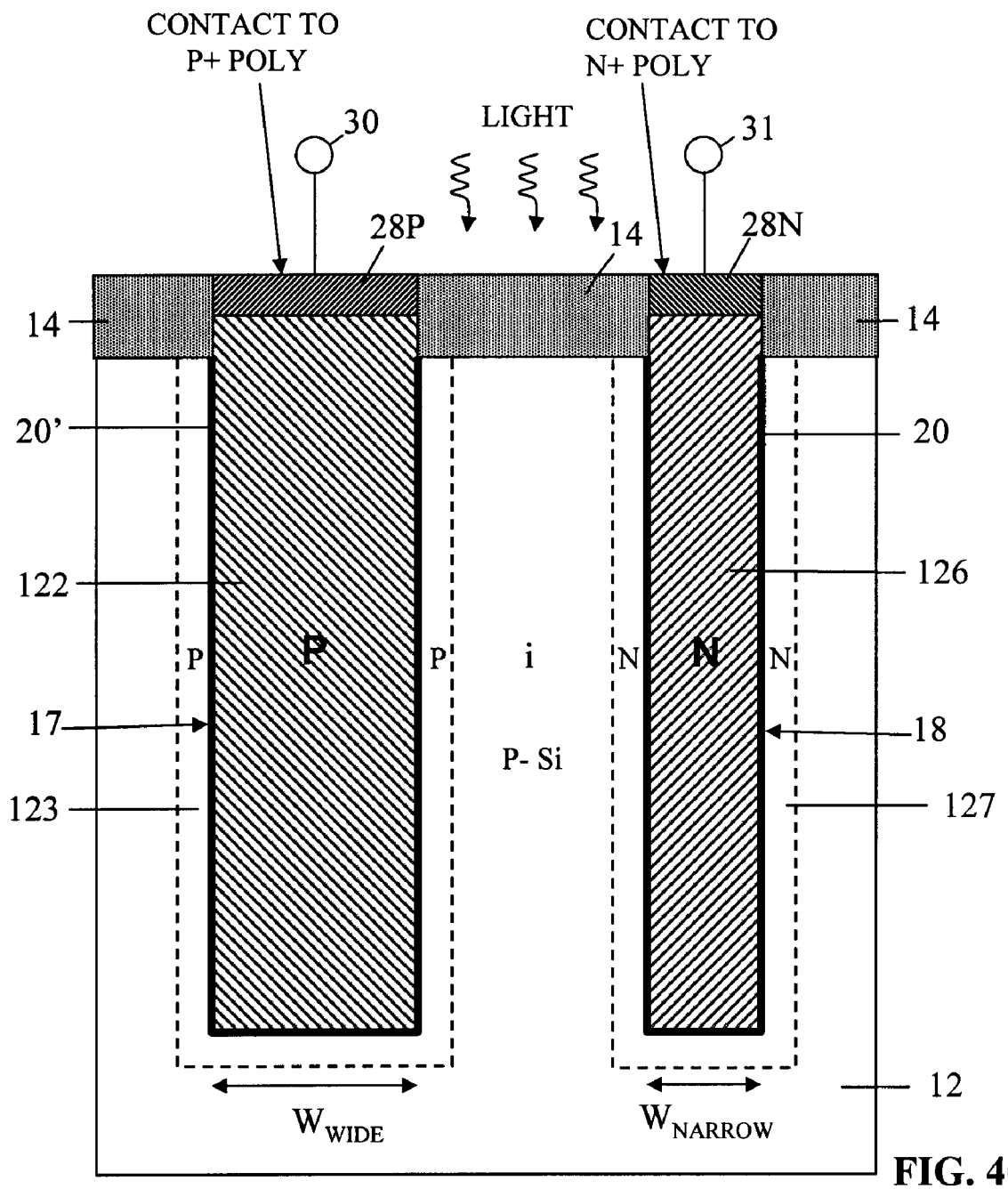

In step 61 as shown in FIG. 4G, the contact 28P has been formed on the top surface of node 122 and contact 28N has been formed on the top surface of node 126.

The process flow of the first process ends in step 62.

FIGS. 4A–4G illustrate the steps in accordance with this invention described above in connection with FIG. 3. The steps of FIGS. 4A–4G are performed for the manufacture of a trench lateral p-i-n photodiode device 100, which is shown in its completed form in FIGS. 2A and 4G.

FIG. 4A is a sectional view a semiconductor substrate 12 covered with a blanket pad layer 14 (which may be laminated layers of silicon oxide and silicon nitride) which in turn was covered by a blanket hardmask layer 15. An imaging layer 16, e.g., photoresist, was formed over the hardmask layer 15. Layers 15 and 16 are shown in the drawings as being planar. The imaging layer 16 is then patterned with a wide window 16W therethrough for forming a wide trench 17 and a narrow window 16N therethrough for forming a narrow trench 18. The imaging layer can be patterned by any imaging techniques such as optical lithography, electron beam lithography, X-ray lithography, ion beam lithography. The patterned imaging layer 16 is then used to etch the wide window 16W and the narrow window 16N through the hardmask layer 15. Finally, as indicated by FIG. 4A, the wide window 16W and the narrow window 16N were opened by etching through the pad layer 14 down to the top of the substrate 12. The wide window 16W has a width of $W_{WIDE}$ and the narrow window has a width of $W_{NARROW}$ as shown in FIG. 4A. Preferably, the hardmask and the pad layer are etched by reactive ion etching (RIE).

FIG. 4B shows the device of FIG. 4A after etching the two trenches in the semiconductor substrate 12 by etching with one trench being wider than the other trench producing the deep wide trench 17 with a width of $W_{WIDE}$ and the deep narrow trench 18 with a width of $W_{NARROW}$. Preferably, the deep trenches 17 and 18 are formed by RIE process.

In FIG. 4C the remaining portions of the hardmask layer 15 have been stripped and both the wide trench 17 and the narrow trench 18 have been filled with a conducting material 126B containing a first type of dopant (e.g. N-type) which will be used to form a first node 126. The filling process is performed in a way such that the narrow trench 18 is completely filled while the wide trench 17 is partially filled.

In accordance with step 57 in FIG. 3 the blanket conformal layer is deposited until the first trench filling layer 126B, which is shown as being N-type doped, fills the narrow trench 18 completely, but the first trench filling layer 126B only partially fills the wide trench 17. This is achieved by depositing the conformal first trench filling layer 126B with a thickness ($t_{poly}$) greater than the half of the width ($W_{narrow}$) of the narrow trench 18, but less than half the width ($W_{wide}$), of the wide trench 17 i.e. $\frac{1}{2}W_{narrow} < t_{poly} < \frac{1}{2}W_{wide}$.

The first trench filling layer 126B may be composed of any conducting materials doped with a first type of dopant. For example, the trenches may be filled with polysilicon, germanium and/or silicon germanium by using conventional chemical vapor deposition (CVD) processes such as low-pressure CVD (LPCVD), plasma enhanced CVD (PECVD), rapid thermal CVD (RTCVD), ultra high vacuum CVD (UHVCVD). Alternatively, Atomic-Layer Deposition (ALD) or epitaxial growth may be used. The filling material is doped with a first type of dopant. For example, P, As, Se may be used as an N-type dopant; and B, Ga and In may be used as P-type dopant. The deposition and the doping processes may be performed simultaneously (in-situ doping), alternatingly (deposition-doping-deposition . . . ), or separately (doping after deposition) as will be well understood by those skilled in the semiconductor art.

Preferably, the first trench filling material 126B is in-situ arsenic doped polysilicon formed by LPCVD.

Optionally, a thin liner 20 may be formed on trench sidewalls and bottoms before the wide trench 17 and narrow trench 18 are filled with the conductive, first trench filling material 126B. This thin liner 20 will act as etch stopping layer when the first trench filling material 126B is removed from the wide trench 17, in the next step. It also prevents the formation of defects such as dislocations at the interface of a first trench filling material 126B such as polysilicon and a single-crystal silicon substrate 12, when a first trench filling material 126B such as polysilicon is used to fill the wide trench 17 and the narrow trench 18. Preferably the thin liner 20 is a thin layer of silicon nitride which is thin enough to allow electrons and holes to tunnel therethrough. The thickness of a silicon nitride liner 20 is preferably thinner than 15 angstroms (Å) and it is preferred to have a thickness between about 5 Å and about 10 Å. Preferably, the silicon nitride liner 20 is formed by thermal growth. Alternatively the thin silicon nitride liner 20 can be formed by deposition such as low-pressure CVD (LPCVD) or atomic layer deposition (ALD). Other materials, including but not limited to Ge, SiGe, WSix, TiN, Ta, Ti, or SiC, etc., may be used as the thin liner 20.

FIG. 4D shows the device 100 of FIG. 4C after etching back the first trench filling layer 126B to remove it from the wide trench 17. The first trench filling layer 126B is etched back with an etching target equal to or slightly greater than the original polysilicon thickness. If present, the thin silicon nitride layer 20 will prevent the material of the intrinsic semiconductor substrate 12 from being etched.

Since the wide trench 17 is partially filled while the narrow trench 18 is completely filled, the filling material 126B can be completely removed from the wide trench 17 while the narrow trench 18 remains filled. The filling material 126B may be removed by a wet or dry etch process in which the etch target is set to remove the filling material from the top of the device 100 and the sidewalls and bottoms of the wide trench 17.

The optional thin liner 20 underneath the filling material may act as an etch-stopping layer. For example, ammonia, ammonia-based etchant (e.g. tetramethyl ammonium hydroxide (TMAH)), or a mixture of nitric and hydrofluoric acid may be used to remove a trench filling material 126B such as polysilicon from the wide trench 17 and the top surface of the device 100. Alternatively, the trench filling material 126B may be removed by a dry etch process. For example if the trench filling material 126B is polysilicon, a plasma containing fluorine or chlorine gas may be used as an etchant.

FIG. 4E shows the device 100 of FIG. 4D after filling the wide trench 17 with a second conductive trench filling layer to form a second node 122 composed of any conducting materials doped with a second type of dopant. For example, if the narrow trench 18 is filled with N-type doped polysilicon, then the can be formed in the 122 wider trench 18 by filling it with P-type doped polysilicon, which is the opposite type of doping.

The second conductive trench filling material for forming the second node 122 may be any conducting material doped with a second type of dopant. For example, the wide trench(es) 17 may be filled with polysilicon, germanium and/or silicon germanium by using conventional chemical vapor deposition (CVD) processes such as low-pressure CVD (LPCVD), plasma enhanced CVD (PECVD), rapid thermal CVD (RTCVD), ultra high vacuum CVD (UH-VCVD). Alternatively, Atomic-Layer Deposition (ALD) or epitaxial growth may be used. The filling material is doped with a second type of dopants. For example, P, As, Se may be used as N-type dopant and B, Ga and In may be used as P-type dopant. The deposition and the doping processes may be performed simultaneously (in-situ doping), alternatingly (deposition-doping-deposition . . . ), or separately (doping after deposition).

Preferably, the second conductive trench filling 122 is in-situ arsenic doped polysilicon formed by LPCVD.

Optionally, a supplemental thin liner 20' may be formed on sidewall(s) and bottom(s) of the wide trench(es) 17 before the trench(es) 17 are filled with the second conductive material 122. This liner 20' prevents the formation of defects such as dislocations at the interface of polysilicon and single-crystal silicon substrate 12 when polysilicon 122 is used to fill the wide trench(es) 17. The liner 20' may be the remainder of the original liner 20 or the entire original liner 20, if the liner 20 is not stripped after removing the first filling material 126B is removed from the wide trench 17. Alternatively, the liner 20 is stripped and a second liner 20' is formed.

If the first liner 20 is stripped and the second liner 20' is formed on the exposed surface of the wider trench, preferably, the liner 20' is preferably a thin layer of silicon nitride which is thin enough to allow electrons and holes to tunnel therethrough. The thickness of a silicon nitride liner 20 is preferably thinner than 15 Å and it is preferred to have a thickness between about 5 Å and about 10 Å. Preferably, the silicon nitride liner is formed by thermal growth. Alternatively, it can be formed by deposition such as low-pressure CVD (LPCVD) or atomic layer deposition (ALD). Other materials include but are not limited to the materials as follows: Ge, SiGe, WSix, TiN, Ta, Ti, or SiC, etc., may be used as the liner 20'. The second conductive filling material 122 may be planarized by using any planarization process such as Chemical Mechanical Polishing (CMP). The pad layer 14 will act as stopper for planarization process.

FIG. 4F shows the device 100 of FIG. 4E after performing a thermal anneal to drive the dopants from the conductive filling materials of the nodes 122/126 (e.g. the doped trench polysilicon) diffusing into the substrate 12 to form the p-i-n structure.

The annealing temperature ranges from 700° C. to 1250° C., preferably from 800° C. to 1200° C., more preferably from 900° C. to 1100° C., and most preferably from 950° C. to 1050° C. The annealing time ranges from 2 seconds to 2 hours depending on the annealing temperature. Preferably, the annealing time ranges from 30 seconds to 10 minutes, more preferably from 60 seconds to 5 minutes, and most preferably from 90 seconds to 180 seconds. The dopants from the filling materials diffuse into the substrate 12 in the annealing process. The dopant is driven from the node 122 into the substrate 12 surrounding the node 122 to form the first doped outdiffusion region 123 in substrate 12. Simultaneously, the dopant is driven from the node 126 into the substrate 12 surrounding the node 126 to form a second doped outdiffusion region 127 in the substrate 12.

The outdiffusion regions 123 and 127 which are formed by the diffusion caused by the anneal process are oppositely doped after the anneal process because the nodes 122 and 126 are oppositely doped. The oppositely doped regions 123 and 127, along with an intrinsic substrate region sandwiched between the oppositely outdiffusion doped regions 123 and 127, form a p-i-n structure.

Optionally, a cap layer 150, composed of a material such as undoped silicon oxide, silicon nitride, or silicon carbide, may be formed atop the device 100, or at least atop the nodes 122 and 126, to prevent dopant outdiffusion which otherwise may results in contamination in the annealing process. The cap layer 150 is stripped after the annealing process has been completed.

FIG. 4G shows the device 100 of FIG. 4F after forming contact 28P to node 122 and contact 28N to node 126. The contacts 28P and 28N can be formed by forming a silicide atop of trench polysilicon. Alternatively, the nodes 122 and 126 may be recessed and the recessed regions are filled with a conducting material such as tungsten atop the recessed node 122 and the node 126.

Second Embodiment

Figure 5A:
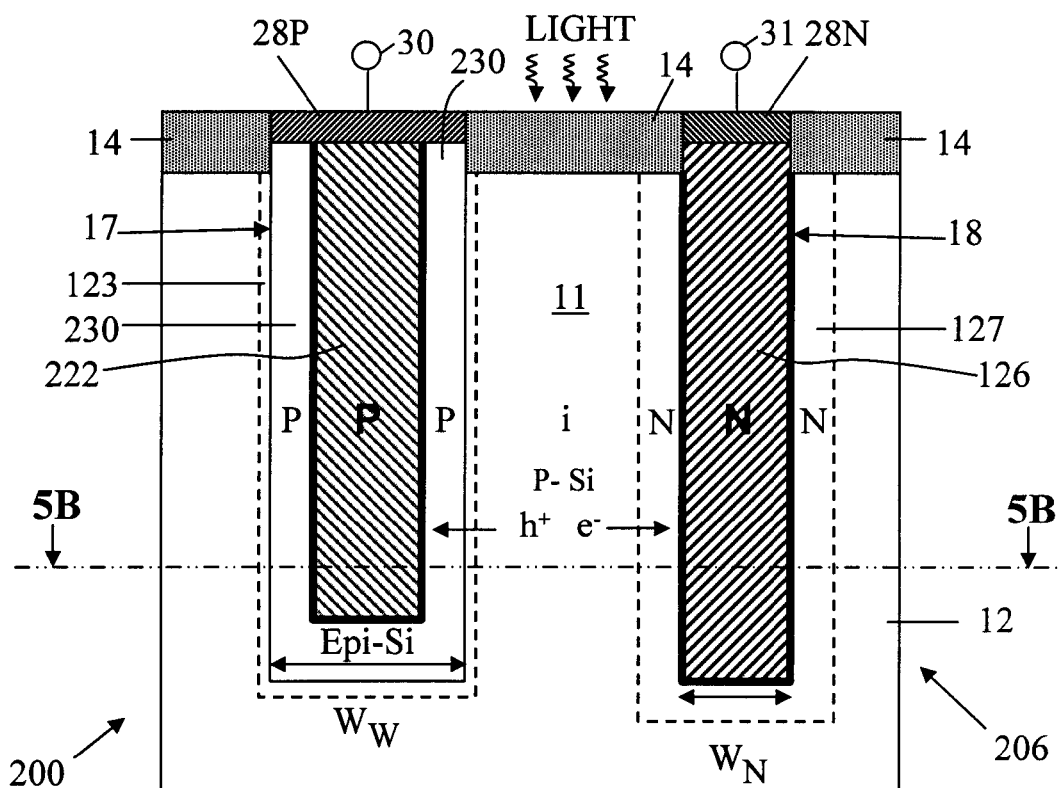
FIGS. 5A and 5B show sectional and plan views of an optical device comprising a modified lateral trench, p-i-n diode photodetector manufactured by a modification of the process of FIGS. 2A–2B in accordance with a second embodiment of this invention.
Figure 5B:
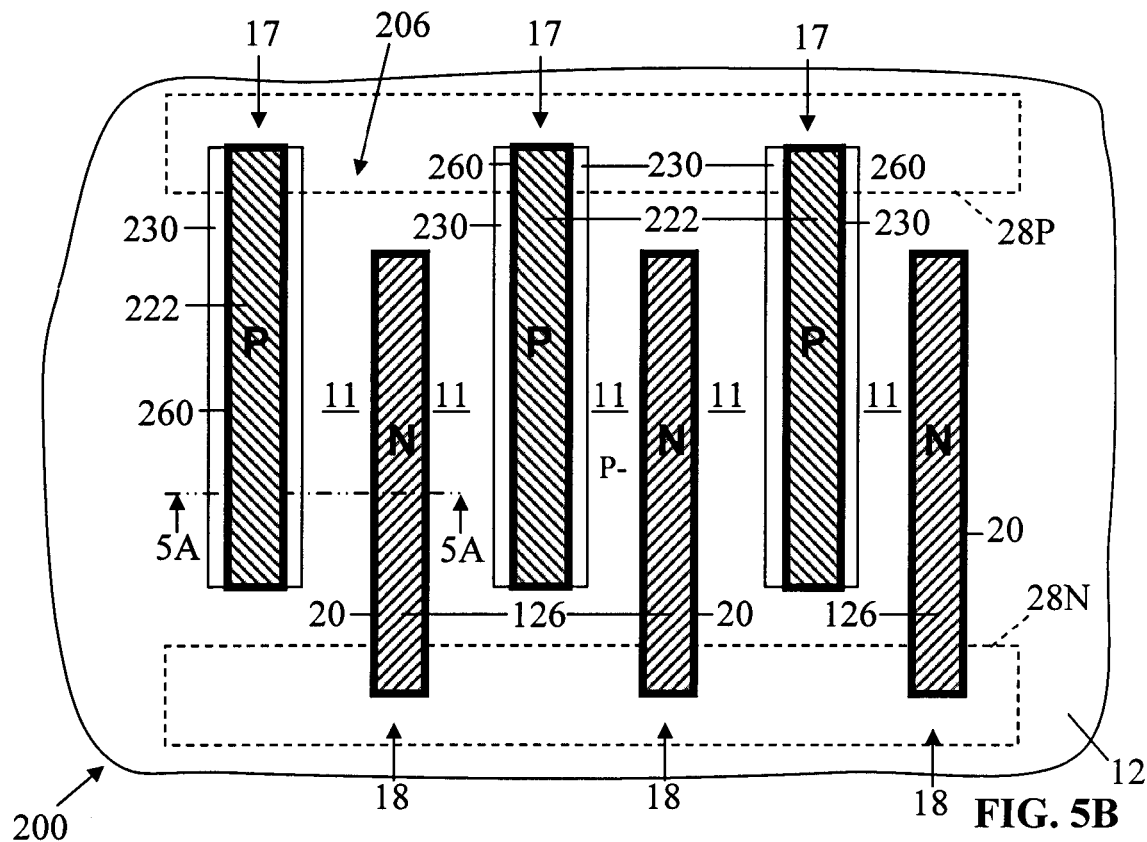

FIGS. 5A and 5B show sectional and plan views of a modified lateral trench, p-i-n diode photodetector manufactured by a modification of the process of FIGS. 2A–2B in accordance with this invention. FIG. 5A shows a sectional elevation taken along line 5A—5A in FIG. 5B of a single lateral trench p-i-n photodiode with a wide trench lined with epitaxial silicon. FIG. 5B shows an array of lateral trench p-i-n photodiodes connected in parallel taken along line 5B—5B in FIG. 5A.

FIG. 5A shows a sectional elevation of a modification of the single lateral trench p-i-n photodiode of FIG. 2A in which the wide trench 17 has been lined with a conformal epitaxial silicon layer 230 prior to formation of the node 222 of the second electrode. In accordance with this modification of the method of this invention, after the first trench filling material 126 (polysilicon) was removed from the wide trench 17, and a conformal epitaxial silicon layer was grown narrowing the wide trench 17.

FIG. 5B shows an array of lateral trench p-i-n photodiodes connected in parallel with the wide trenches 17 lined with the epitaxial silicon layer 230.

Figure 6:
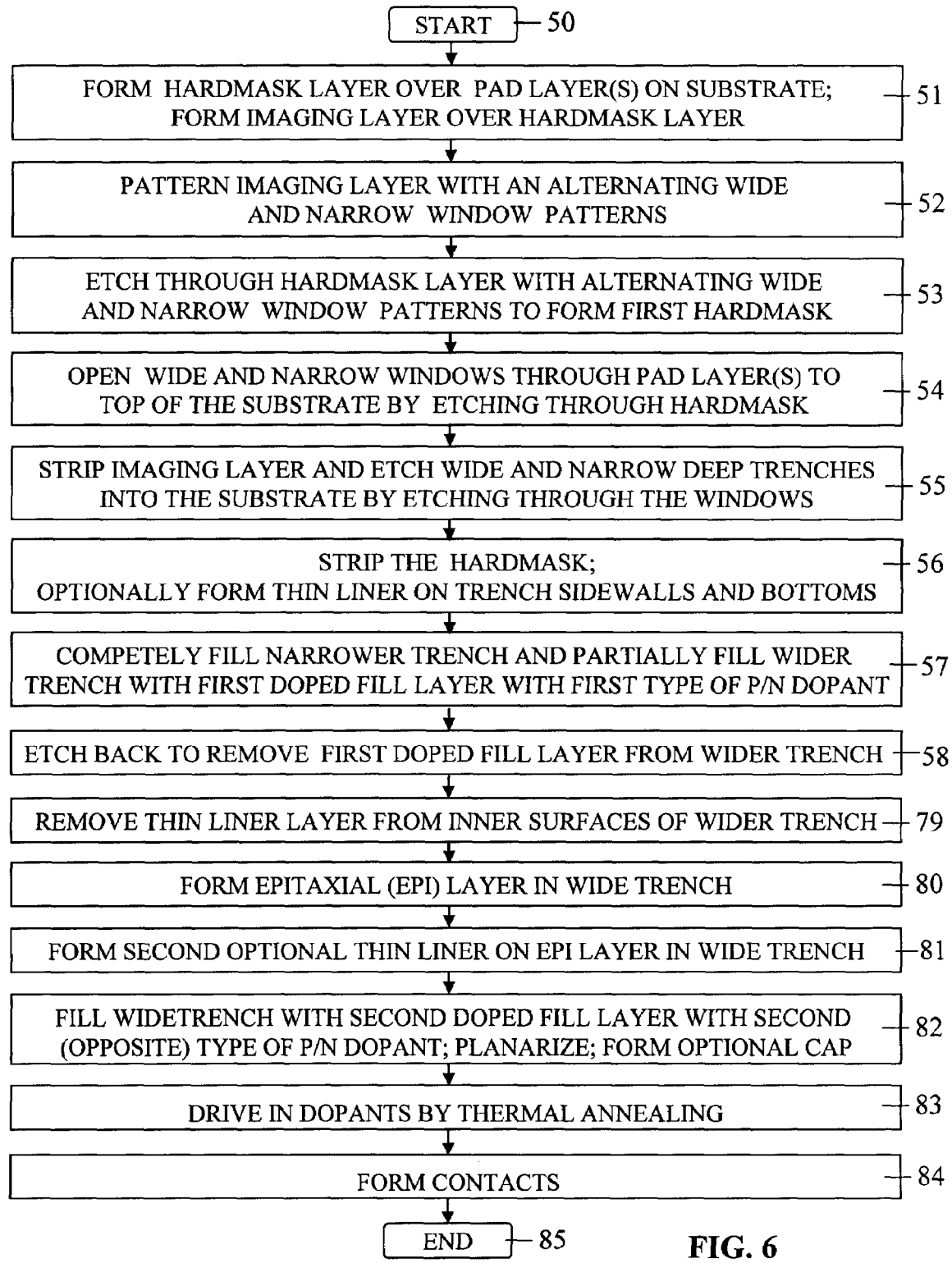
FIG. 6 shows a process flow of a second embodiment of a process in accordance with the second embodiment of this invention for forming the photodetector of FIGS. 7A–7E.

FIG. 6 is a flowchart which is a modification of the flow chart of FIG. 3 with the process steps being the same as in FIG. 3 up to the step of removing the first filling material from the wide trench 17 while the narrow trench 18 remains filled. In other words, steps 51–58 are identical to those in FIG. 3 and the description thereof is incorporated here by reference.

Figure 7A:
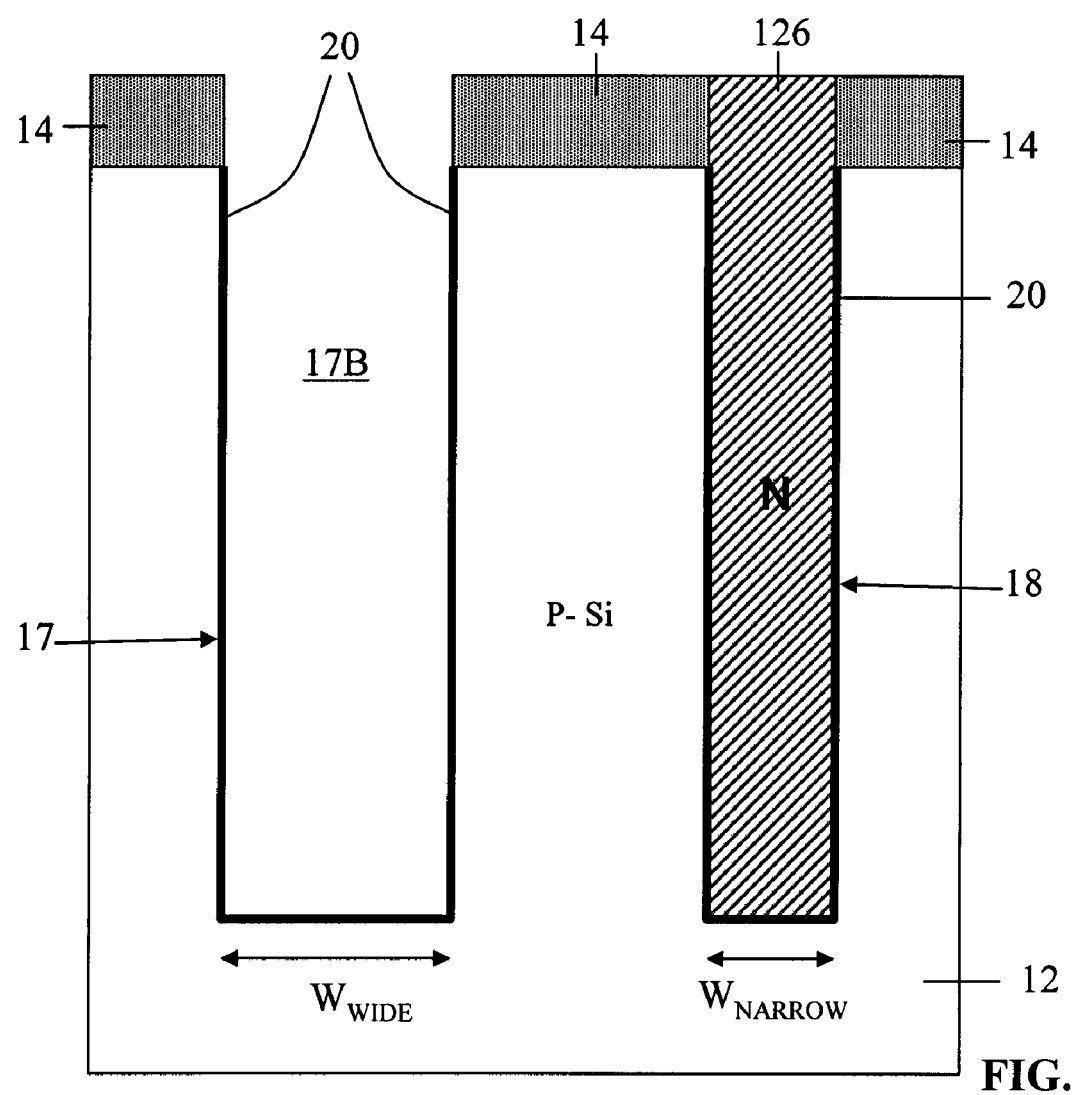
FIGS. 7A–7E illustrate the steps performed in the manufacture of an optical device comprising a trench lateral p-i-n photodiode device which is shown in its completed form in FIGS. 5A and 7E in accordance with the second embodiment of this invention.

FIG. 7A shows the photodetector 200 at the end of step 57 with the optional liner 20 in place on the sidewalls and bottom of the trench 17B, as in FIG. 4D.

Figure 7B:
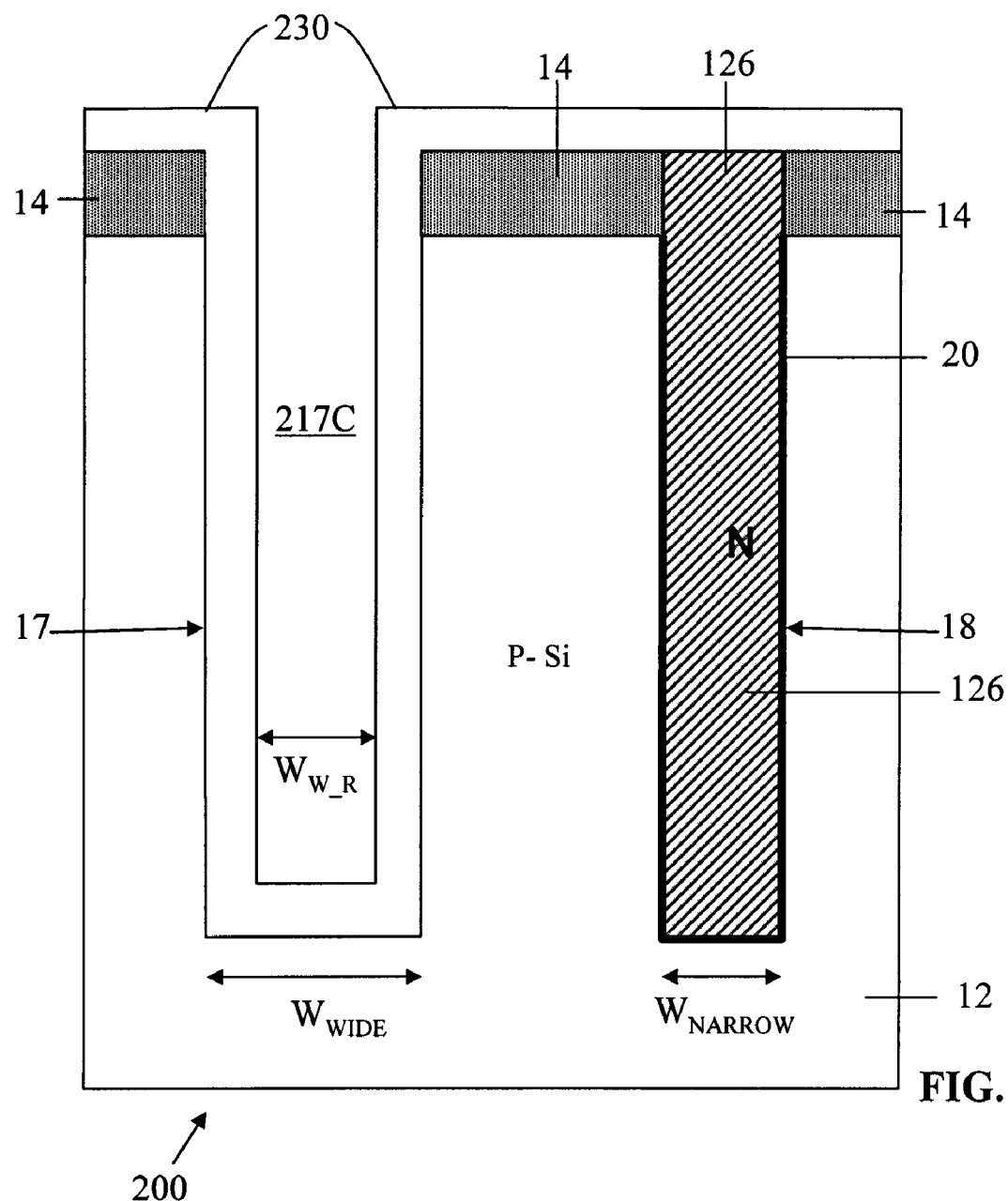

FIG. 7B shows the device of FIG. 7A after performance of step 79 in FIG. 6, which follows step 57, and step 80 in FIG. 6.

In FIG. 7B the optional liner 20 (composed of silicon nitride or the like as described above) has been removed from the sidewalls and bottom of the wide trench 18 in the photodetector 200. Not only is the liner 20 optional, but the process of removal of the liner 20 is also optional, and is necessary only if a liner 20 is indeed formed underneath the filling material. In any event the point is that the liner 20, if present, may be removed before forming the epitaxial layer 230 in step 80.

In step 80, as shown in FIG. 7B, a conformal epitaxial layer 230, e.g. silicon, has been deposited onto device 200, partially filling the trench 17 and covering the top of the photodetector 200 aside from trench 17, but leaving a substantial opening 217C providing sufficient space for formation of a P-type doped node 222, i.e. the second electrode therein. This process of forming an epitaxial layer 230 in the wider trench 222 has the effect of reducing its effective width to a dimension $W_{W\_}^{R}$ ($W_{W\_}^{REDUCED}$) similar to or substantially equal to the narrower one $W_N$ ($W$ NARROW). In other words the reduced width $W_{W\_}^{R}$ of the wide trench 17 within the opening 217C is on the order of being equal to the width $W_N$ of the narrow trench 18, so that $W_{W\_}^{R} \approx W_N$.

The growth of the epitaxial silicon (epi-Si) layer 230 may be conducted by Chemical Vapor Deposition (CVD) processes such as Low-Pressure CVD (LPCVD), Plasma Enhanced CVD (PECVD), Rapid Thermal CVD (RTCVD), and Ultra High Vacuum CVD (UHVCVD). Alternatively, the epi-Si layer may be formed by molecular beam epitaxy (MBE) growth.

Figure 7C:
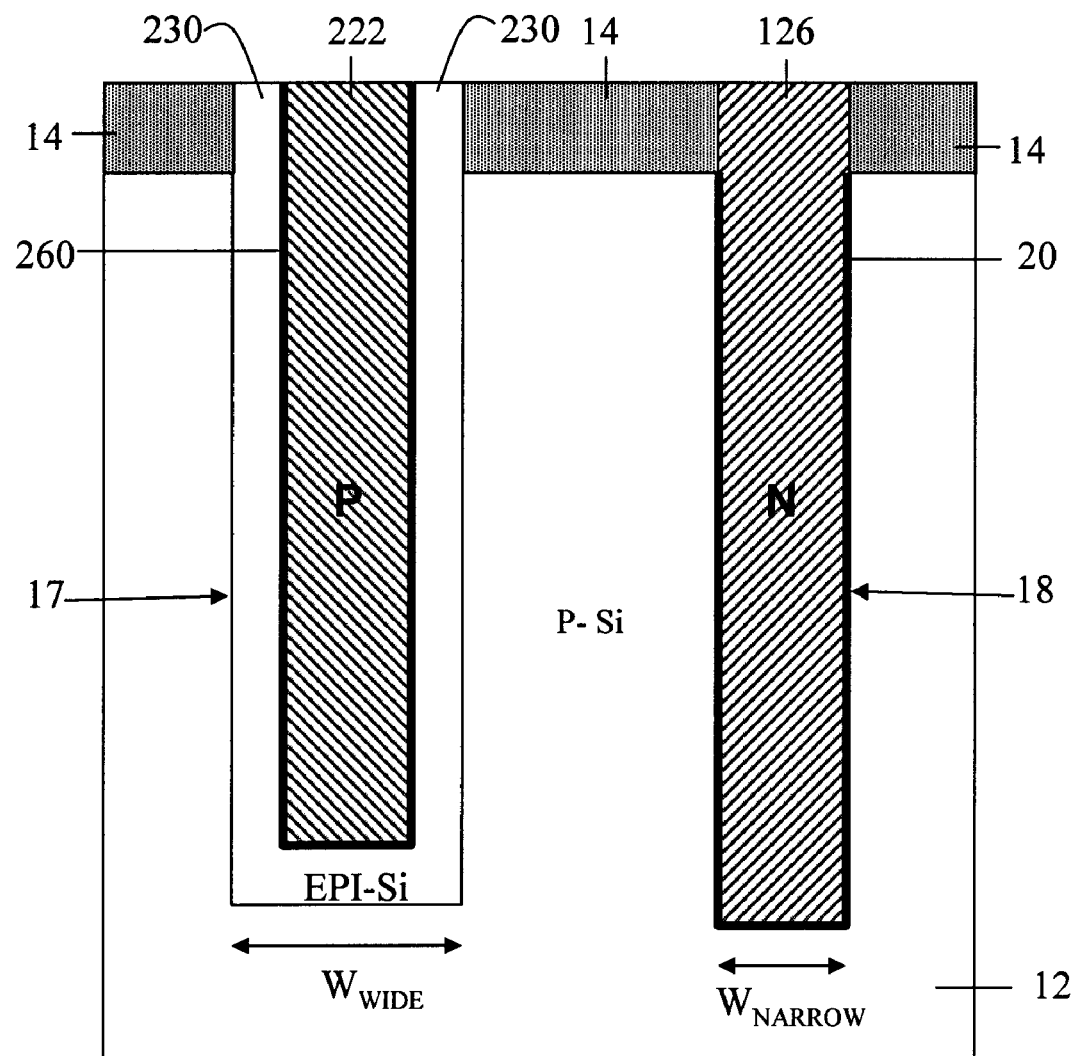

FIG. 7C shows the device of FIG. 7B after performance of steps 81 and 82 in FIG. 6.

In step 81, as shown in FIG. 7C there is an option that a second liner 260, preferably composed of silicon nitride, may be formed on trench sidewalls and bottom of the conformal layer 230 before the trenches are filled with the second fill material to form the P-type doped node 222 in step 82. In step 82 as shown in FIG. 7C, the wide trench 17 has been filled with a blanket, second conductive fill layer 222. The second conductive fill layer 222 preferably comprises a P-type doped, polysilicon layer. The conductive fill layer 222 (e.g. a P-type doped, polysilicon layer forming the second electrode) has been planarized along with the portion of conformal layer 230 of epitaxial silicon aside from trench 17 to the level of the top surface of the pad layer(s) 14. The second conductive filling material 222 may be planarized by using any planarization process such as etching back or Chemical Mechanical Polishing (CMP). The pad layer 14 will act as stopper for the planarization process.

Figure 7D:
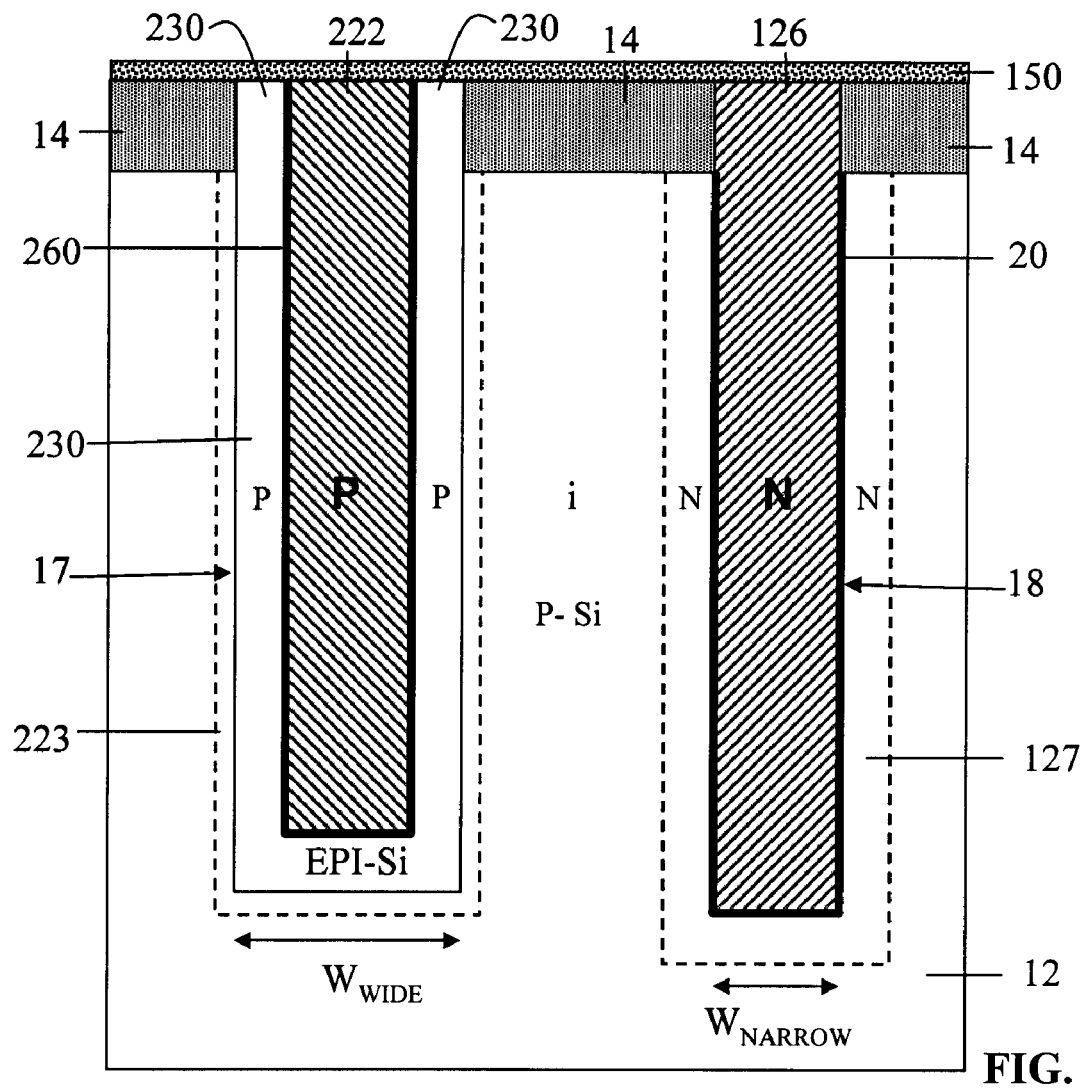

FIG. 7D shows the device of FIG. 7C after performance of steps 83 in FIG. 6 in which an anneal has been performed to drive dopant from the filling materials of the second electrode 222 and the first electrode 126 by diffusion into the substrate 12 to form a p-i-n structure. The dopant from the P-doped node 222 is driven by diffusion from the node 122 into the substrate 12 forming an outdiffusion region 223 with P-type doping surrounding the node 222. The dopant from the N-type doped node 126 is driven by diffusion from the node 126 into the substrate 12 forming an outdiffusion region 127 with N-type doping surrounding the node 126.

Furthermore, at this point, prior to the annealing step, an optional cap layer 150 composed of a material such as silicon oxide, silicon nitride, or silicon carbide, may be deposited over the top surfaces of device 200 and in particular across the top of the node 222 and the top of the node 126 to prevent cross-doping therebetween during the following annealing process. If a cap layer 150 has been applied to the top surfaces of device 200, then the cap layer 150 is stripped following the annealing process.

Figure 7E:
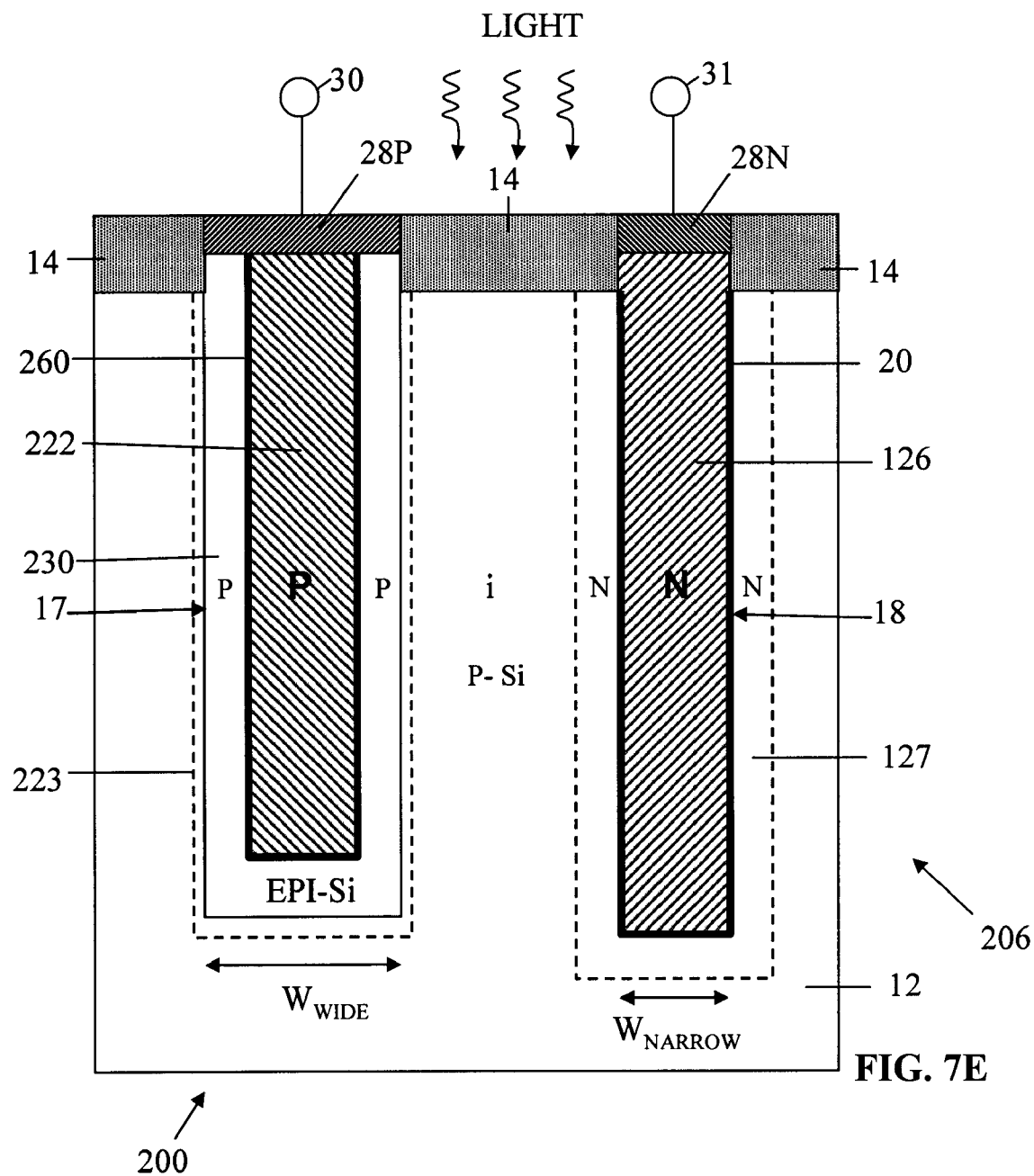

FIG. 7E shows the device of FIG. 7D after performance of steps 84 in FIG. 6.

In step 84 as shown in FIG. 7E contacts have been formed. The contact 28P has been formed on the top surface of node 222 and contact 28N has been formed on the top surface of node 126.

The process flow of the second embodiment ends in step 85.

SOI Embodiments

Figure 8A:
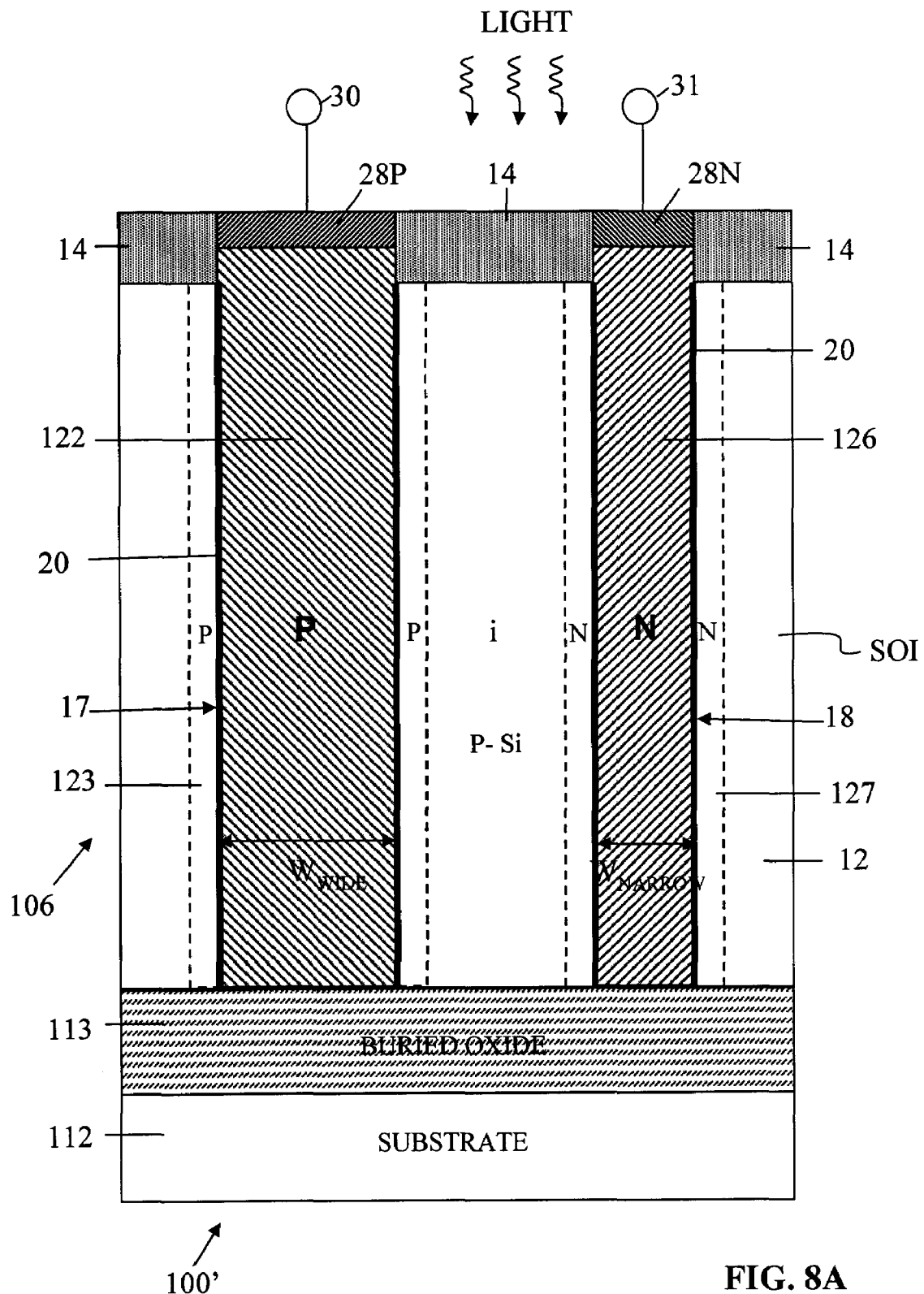
FIGS. 8A and 8B show sectional and plan views of an optical device comprising a lateral trench, p-i-n diode photodetector manufactured by a modification of the process of FIGS. 2A–2C, 3 and 4G in accordance with this invention.
Figure 8B:
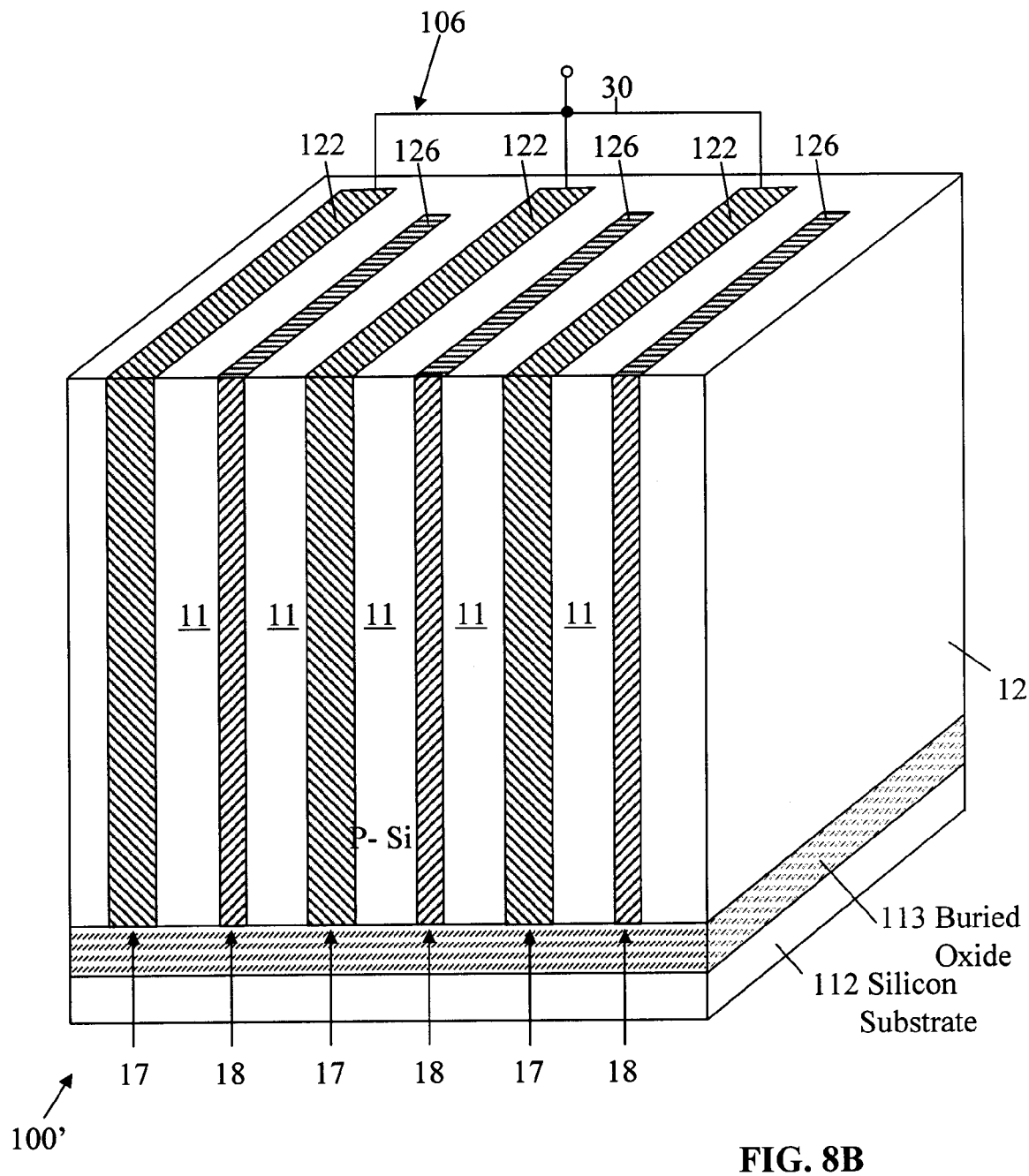

FIGS. 8A and 8B show sectional and plan views of a lateral trench, p-i-n diode photodetector manufactured by a modification of the process of FIGS. 2A–2C, 3 and 4G in accordance with this invention.

In FIG. 8A a photodetector device 100' is shown comprising a modification of the photodetector 100 of FIGS. 2A and 4G with the photodetector of FIG. 8A built on an SOI substrate 112 with a BOX layer 113 formed on the SOI substrate 112 and the photodetector substrate 12 formed on the BOX layer 113. Otherwise the process and the structure are the same as in FIGS. 4A–4G. Please refer to U.S. Pat. No. 6,538,299 of Kwark entitled "Silicon-On-Insulator (SOI) Trench Photodiode" cited above for a full description of the benefits of an SOI embodiment.

FIG. 8B shows a perspective view of the device 100' of FIG. 8A, which is analogous to similar views described hereinabove.

Figure 9:
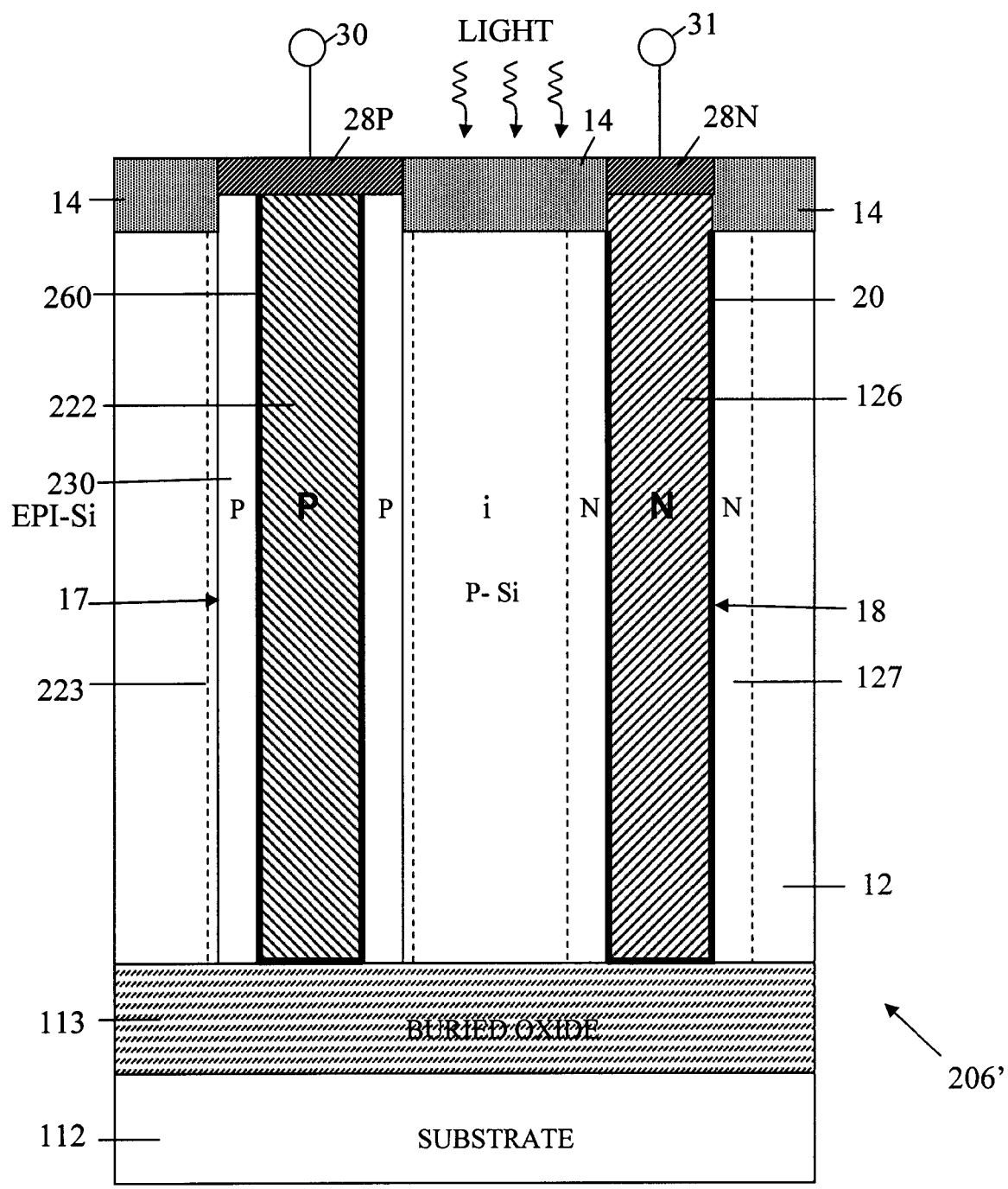
FIG. 9 shows a sectional view of an optical device comprising a lateral trench, p-i-n diode photodetector manufactured by a modification of the process of FIGS. 5A–5B and 6 in accordance with this invention.

FIG. 9 shows a sectional view of a lateral trench, p-i-n diode photodetector 300'' manufactured by a modification of the process of FIGS. 5A–5B, 6 and 7A–7E in accordance with this invention. In FIG. 9 a detector 300' is shown which is a modification of detector 300 of FIG. 7E with the photodetector built on SOI substrate 112 with a BOX layer 113 formed on substrate 112 and the substrate 12 formed on the BOX layer 113. Otherwise the process and the structure are the same as in FIGS. 7A–7E. Please refer to U.S. Pat. No. 6,538,299 of Kwark entitled "Silicon-On-Insulator (SOI) Trench Photodiode" cited above for a full description of the benefits of an SOI embodiment.

Advantages

Some obvious advantages of the process of this invention are as follows:

There is a saving of one mask set since only one mask set is needed to form the alternating N-type and P-type trenches.

There is a saving of one hardmask deposition and etch process, since only one hardmask process is needed.

There is a saving of one planarization process.

There is no alignment issue.

Less process time and complexity are required.

The process control is easy.

The process is less susceptible to defect generation.

While this invention has been described in terms of the above specific embodiment(s) of photodetectors, those skilled in the art will recognize that the invention can be practiced with modificain the broad field of semiconductor devices within the spirit and scope of the appended claims, i.e. that changes can be made in form and detail, without departing from the spirit and scope of the invention. Accordingly all such changes come within the purview of the present invention and the invention encompasses the subject matter of the following claims.

What is claimed is:

1. A semiconductor device on a semiconductor substrate, comprising:
   an array of parallel trenches formed on the semiconductor substrate comprising alternating wide trenches and narrow trenches;
   a plurality of first electrodes formed in the narrow trenches composed of a first fill material of a first conductivity type;
   a plurality of second electrodes formed in the wide trenches composed of a second fill material of an opposite conductivity type;
   a first set of outdiffusion regions doped with dopant diffused from the first electrode into a region in the substrate about the periphery of the corresponding narrow trench; and
   a second set of outdiffusion regions doped with dopant diffused from the second electrode into a region in the substrate about the periphery of the corresponding wide trench.

2. The device of claim 1 wherein the semiconductor device is a photodetector.

3. The device of claim 1 wherein an epitaxial silicon layer is formed on trench sidewalls of the wide trench leaving a space filled with the second electrode narrowing the wide trench from a width $W_{WIDE}$ to a width $W_{W\_}^{R}$.

4. The device of claim 3 wherein the wide trench with the epitaxial layer formed on trench sidewalls has the same opening width $W_{W\_}^{R}$ as the narrow trench width $W_{NARROW}$.

5. The device of claim 1 with a liner is deposited on the walls of the narrow trench and the wide trench.

6. The device of claim 1 including:
   a contact to the first electrode, and
   a contact to the second electrode.

7. The device of claim 1 including a pad layer formed over the substrate aside from the trenches with the pad layer comprising a layer through which light passes.

8. The device of claim 1, wherein:
   the material of the first conductivity comprises N-type doped polysilicon: and
   the material of the second conductivity comprises P-type doped polysilicon.

9. The device of claim 2, wherein:
   the material of the first fill material comprises N-type doped polysilicon: and
   the material of the second fill material comprises P-type doped polysilicon.

10. The device of claim 1, wherein the semiconductor substrate is formed over a buried oxide layer.

11. The device of claim 1, wherein the semiconductor substrate is composed of a material selected from the group consisting of Si, strained Si, $Si_{1-y}C_y$, $Si_{1-x-y}Ge_xC_y$, $Si_{1-x}Ge_x$, Si alloys, Ge, Ge alloys, GaAs, InAs, InP as well as other III–V semiconductors, II–VI semiconductors, Si-containing materials, a Silicon-On-Insulator (SOI) substrates or a SiGe-On-Insulator (SGOI) substrates.

12. The device of claim 1, wherein the liner material is composed of a material selected from a group consisting of silicon nitride, Ge, SiGe, WSix, TiN, Ta, Ti, and SiC.

13. A photodetector device formed on a semiconductor substrate, comprising:
   a wide trench and a narrow trench formed in the substrate;
   a first electrode formed in the narrow trench of a deposit of a first fill material of a first conductivity type filling the wide trench partially and filling the narrow trench completely;
   an epitaxial semiconductor layer formed in the wide trench leaving a narrowed wide trench therein;
   a second electrode formed in the wide trench by a second fill material of an opposite conductivity type;
   dopant diffused from the second electrode into a region in the substrate about the periphery of the wide trench; and
   dopant diffused from the first electrode into a region in the substrate about the periphery of the narrow trench.

14. The photodetector device of claim 13 including a pad layer is formed over the substrate aside from the trenches with the pad layer comprising a layer through which light passes.

15. The photodetector device of claim 13, wherein
   a first liner is formed on the walls of the narrow trench; and
   the first fill material is deposited within the first liner inside the narrow trench.

16. The photodetector device of claim 15, wherein:
   a second liner is formed on the walls of the narrowed wide trench; and the second fill material is deposited within the second liner inside the narrowed wide trench.

17. The photodetector device of claim 16, wherein the first liner and the second liner is composed of a material selected from a group consisting of silicon nitride, Ge, SiGe, WSix, TiN, Ta, Ti, and SiC.

18. The photodetector device of claim 15 including:
a silicide contact to the first electrode and
a silicide contact to the second electrode.

19. A semiconductor device comprising an array of lateral trench p-i-n photodiodes connected in parallel formed on a semiconductor substrate, comprising:
an array of parallel trenches formed in the substrate comprising alternating wide trenches and narrow trenches;
a plurality of first electrodes with each thereof formed in one of the narrow trenches, each first electrode being composed of a first fill material of a first conductivity type;
a plurality of second electrodes with each thereof formed in one of the wide trenches, each second electrode being composed of a second fill material of an opposite conductivity type;
a first set of outdiffusion regions doped with dopant diffused from the first electrode into a region in the substrate about the periphery of the corresponding narrow trench; and
a second set of outdiffusion regions doped with dopant diffused from the second electrode into a region in the substrate about the periphery of the wide trench about the periphery of the corresponding wide trench.

20. The device of claim 19 including
a pad layer formed over the substrate aside from the trenches with the pad layer comprising a layer through which light passes;
a first liner is formed on the walls of the narrow trench and the first fill material is deposited within the first liner inside the narrow trench;
a second liner is formed on the walls of the narrowed wide trench and the second fill material is deposited within the second liner inside the narrowed wide trench; and
the liner material is composed of a material selected from a group consisting of silicon nitride, Ge, SiGe, WSix, TiN, Ta, Ti, and SiC.

* * * * *